US009734921B2

(12) United States Patent
Ware et al.

(10) Patent No.: US 9,734,921 B2
(45) Date of Patent: Aug. 15, 2017

(54) MEMORY REPAIR USING EXTERNAL TAGS

(71) Applicant: Rambus Inc., Sunnyvale, CA (US)

(72) Inventors: Frederick A. Ware, Los Altos Hills, CA (US); Suresh Rajan, Fremont, CA (US); Ian Shaeffer, Los Gatos, CA (US)

(73) Assignee: Rambus Inc., Sunnyvale, CA (US)

( * ) Notice: Subject to any disclaimer, the term of this patent is extended or adjusted under 35 U.S.C. 154(b) by 125 days.

(21) Appl. No.: 14/407,318

(22) PCT Filed: Oct. 31, 2013

(86) PCT No.: PCT/US2013/067775
§ 371 (c)(1),
(2) Date: Dec. 11, 2014

(87) PCT Pub. No.: WO2014/074390
PCT Pub. Date: May 15, 2014

(65) Prior Publication Data
US 2015/0162101 A1    Jun. 11, 2015

Related U.S. Application Data

(60) Provisional application No. 61/723,157, filed on Nov. 6, 2012.

(51) Int. Cl.
*G11C 29/44* (2006.01)
*G11C 29/00* (2006.01)
*G06F 11/10* (2006.01)

(52) U.S. Cl.
CPC ...... *G11C 29/4401* (2013.01); *G06F 11/1016* (2013.01); *G06F 11/1072* (2013.01); *G11C 29/808* (2013.01); *G11C 29/846* (2013.01)

(58) Field of Classification Search
CPC . G11C 29/4401; G11C 29/808; G11C 29/846; G06F 11/1016; G06F 11/1072
(Continued)

(56) References Cited

U.S. PATENT DOCUMENTS 4,398,248 A    8/1983 Hsia et al.
4,748,627 A    5/1988 Ohsawa
(Continued)

FOREIGN PATENT DOCUMENTS

JP    11-120788 A    4/1999
JP    2000-285695 A    10/2000
(Continued)

OTHER PUBLICATIONS

C. L. Su, R. F. Huang, C. W. Wu, K. L. Luo and W. C. Wu, "A Built-in Self-Diagnosis and Repair Design With Fail Pattern Identification for Memories," in IEEE Transactions on Very Large Scale Integration (VLSI) Systems, vol. 19, No. 12, pp. 2184-2194, Dec. 2011.*
(Continued)

*Primary Examiner* — Cynthia Britt
(74) *Attorney, Agent, or Firm* — The Neudeck Law Firm, LLC

(57) ABSTRACT

A memory device (100) includes an extra column (114) of repair memory tiles. These repair memory tiles are accessed at the same time, and in the same manner as the main array of memory tiles. The output of the repair column is substituted for the output of a column of the main array (112). The main array column that is substituted is determined by tags (121) stored externally to the memory device. The external tags are queried with a partial address of the access. If the address of the access corresponds to an address in the external tags, the tag information is supplied to the memory device. The tag information determines which column in the (Continued)

main array is replaced by the output of the repair column. Since each column of the main array supplies one bit during the access, the repair column enables cell-by-cell replacement of main array cells.

20 Claims, 22 Drawing Sheets

(58) Field of Classification Search
USPC .............................. 714/710, 711, 764, 768
See application file for complete search history.

(56) References Cited

U.S. PATENT DOCUMENTS

| | | |
|---|---|---|
| 5,315,552 A | 5/1994 | Yoneda |
| 5,644,541 A | 7/1997 | Siu et al. |
| 5,758,056 A | 5/1998 | Barr |
| 5,781,717 A | 7/1998 | Wu et al. |
| 5,838,603 A | 11/1998 | Mori et al. |
| 5,910,921 A | 6/1999 | Beffa et al. |
| 6,011,734 A | 1/2000 | Pappert |
| 6,112,321 A | 8/2000 | Shimada et al. |
| 6,182,257 B1 | 1/2001 | Gillingham |
| 6,188,618 B1 | 2/2001 | Takase |
| 6,199,177 B1 | 3/2001 | Blodgett |
| 6,434,064 B2 | 8/2002 | Nagai |
| 6,651,202 B1 | 11/2003 | Phan |
| 6,754,117 B2 | 6/2004 | Jeddeloh |
| 6,801,471 B2 | 10/2004 | Viehmann et al. |
| 6,873,555 B2 | 3/2005 | Hiraki et al. |
| 7,117,421 B1 | 10/2006 | Danilak |
| 7,181,655 B2 | 2/2007 | Ditewig et al. |
| 7,336,549 B2 * | 2/2008 | Min ................ G11C 29/787 365/200 |
| 7,444,577 B2 | 10/2008 | Best et al. |
| 7,464,225 B2 | 12/2008 | Tsern |
| 7,478,285 B2 | 1/2009 | Fouquet-Lapar |
| 7,509,543 B2 * | 3/2009 | Mohr ................. G11C 17/18 365/201 |
| 7,522,464 B2 | 4/2009 | Yoo et al. |
| 7,562,285 B2 | 7/2009 | Yang et al. |
| 7,565,479 B2 | 7/2009 | Best et al. |
| 7,565,593 B2 | 7/2009 | Dixon et al. |
| 7,574,648 B2 | 8/2009 | Akiyama et al. |
| 7,619,938 B2 | 11/2009 | Co et al. |
| 7,620,875 B1 | 11/2009 | Nelson et al. |
| 7,627,792 B2 * | 12/2009 | Di Ronza ............. G11C 29/72 365/201 |
| 7,676,730 B2 | 3/2010 | Haugan et al. |
| 7,734,866 B2 | 6/2010 | Tsern |
| 7,734,985 B2 | 6/2010 | Bains |
| 7,783,957 B2 | 8/2010 | Carnevale et al. |
| 7,831,882 B2 | 11/2010 | Tsern et al. |
| 7,831,888 B2 | 11/2010 | Wang et al. |
| 7,836,378 B2 | 11/2010 | Shaeffer et al. |
| 7,882,423 B2 | 2/2011 | Wang et al. |
| 7,961,542 B2 | 6/2011 | Smith |
| 7,984,329 B2 * | 7/2011 | Lastras-Montano ... G11C 29/76 714/6.2 |
| 8,023,350 B2 | 9/2011 | Bunker et al. |
| 8,132,077 B2 | 3/2012 | Yang et al. |
| 8,132,086 B2 | 3/2012 | Park et al. |
| 8,423,865 B2 | 4/2013 | Lee |
| 2002/0120887 A1 | 8/2002 | Hughes et al. |
| 2002/0124203 A1 | 9/2002 | Fang |
| 2003/0084386 A1 * | 5/2003 | Barth, Jr. ............... G11C 29/42 714/718 |
| 2003/0115518 A1 * | 6/2003 | Kleveland .......... G11C 29/4401 714/718 |
| 2004/0261049 A1 | 12/2004 | Mohr et al. |
| 2005/0041502 A1 | 2/2005 | Perner |
| 2005/0259486 A1 | 11/2005 | Mikol |
| 2006/0200728 A1 * | 9/2006 | Nagai ................. G06F 11/1044 714/763 |
| 2006/0259848 A1 | 11/2006 | Blevins |
| 2006/0271755 A1 | 11/2006 | Miura |
| 2007/0033338 A1 | 2/2007 | Tsern |
| 2007/0109856 A1 | 5/2007 | Pellicone et al. |
| 2007/0297252 A1 | 12/2007 | Singh |
| 2008/0065929 A1 * | 3/2008 | Nadeau-Dostie .. G11C 29/4401 714/5.11 |
| 2008/0109700 A1 | 5/2008 | Lee et al. |
| 2008/0168331 A1 | 7/2008 | Vogelsang et al. |
| 2008/0195894 A1 | 8/2008 | Schreck et al. |
| 2008/0215955 A1 | 9/2008 | Kimbara et al. |
| 2008/0266990 A1 | 10/2008 | Loeffler |
| 2008/0294841 A1 | 11/2008 | Carnevale et al. |
| 2009/0003046 A1 | 1/2009 | Nirschl et al. |
| 2009/0024884 A1 | 1/2009 | Klein |
| 2009/0055714 A1 | 2/2009 | Bains et al. |
| 2009/0063896 A1 | 3/2009 | Lastras-Montano et al. |
| 2009/0129155 A1 | 5/2009 | Honda et al. |
| 2009/0168569 A1 | 7/2009 | Ryu |
| 2009/0235113 A1 | 9/2009 | Shaeffer et al. |
| 2009/0276587 A1 | 11/2009 | Moyer et al. |
| 2009/0316501 A1 | 12/2009 | Bunker et al. |
| 2010/0064186 A1 * | 3/2010 | Houg ..................... G11C 29/76 714/711 |
| 2010/0107036 A1 | 4/2010 | Resnick |
| 2010/0122148 A1 | 5/2010 | Flynn et al. |
| 2010/0128541 A1 | 5/2010 | Russell et al. |
| 2010/0208537 A1 | 8/2010 | Pelley, III et al. |
| 2010/0293437 A1 | 11/2010 | Gollub et al. |
| 2011/0016278 A1 | 1/2011 | Ware et al. |
| 2011/0041005 A1 * | 2/2011 | Selinger ................. G06F 11/10 714/719 |
| 2011/0119551 A1 | 5/2011 | Tsern et al. |
| 2011/0138251 A1 | 6/2011 | Pawlowski |
| 2012/0066567 A1 | 3/2012 | Moyer |
| 2012/0221902 A1 | 8/2012 | Ware et al. |
| 2013/0179751 A1 | 7/2013 | Linstadt |

FOREIGN PATENT DOCUMENTS

| | | |
|---|---|---|
| JP | 2005-174462 A | 6/2005 |
| WO | WO-2012-051039 A1 | 4/2012 |

OTHER PUBLICATIONS

C. Banupriya and S. Chandrakala, "A low power built in repair analyzer for word oriented memories with optimal repair rate," Green Computing Communication and Electrical Engineering (ICGCCEE), 2014 International Conference on, Coimbatore, 2014, pp. 1-5.*

S. K. Thakur, R. A. Parekhji and A. N. Chandorkar, "On-chip Test and Repair of Memories for Static and Dynamic Faults," 2006 IEEE International Test Conference, Santa Clara, CA, 2006, pp. 1-10.*

Barber et al., "A Bare-Chip Probe for High I/O, High Speed Testing," HPL-94-18, Mar. 1994, Hewlett-Packard. 19 pages.

Niggemeyer et al., "A Defect-Tolerant DRAM Employing a Hierarchical Redundancy Scheme, Built-In Self-Test and Self-Reconfiguration," Proceedings, International Workshop on Memory Technology, Design and Testing, Aug. 11-12, 1997, Conference Publications, pp. 33-40. 8 pages.

PCT International Preliminary Report on Patentability dated May 21, 2015 (Chapter I) in International Application No. PCT/US2013/067775. 8 pages.

PCT International Search Report and Written Opinion dated Mar. 5, 2014 in International Application No. PCT/US2013/067775. 16 pages.

* cited by examiner

MEMORY REPAIR USING EXTERNAL TAGS

DETAILED DESCRIPTION

In general, memory devices may have defective memory cells. These cells may be nonfunctioning, or just "weak"—where they do not retain data for a specified minimum amount of time (e.g., 2 mS). Weak cells tend to be a particular problem in dynamic memory devices. In an embodiment, the storage function of a defective cell may be replaced by the storage function of a "repair cell." In other words, the data coming from (or going to) defective memory cells is instead retrieved from (or sent to) an array of corresponding "repair cells." The repair cells may be arranged in an array similar to the main memory array. For example, the repair cells may be arranged as an extra column of memory array tiles (MATs) that are accessed at the same time as the MATs in the main memory array.

In an embodiment, in order to specify which cells need replacing, a tag memory external to the memory device stores the addresses of defective cells in a content-addressable manner. This tag memory is queried when the memory device is accessed. If the tag memory indicates that a read access is to a defective cell, the memory device is instructed to replace the data retrieved from the defective cell with data retrieved from a repair cell. The replacement is done on a cell-by-cell basis—not an entire row or entire column at a time.

In an embodiment, to specify which data is to be replaced by repair cell data, the address of the defective cell (or a portion thereof) is supplied to the memory device via a secondary (repair) address bus. This address informs the memory device which bit(s) of the row being accessed should be replaced by a bit(s) coming from the repair cell array. A write access works similarly, but in the opposite direction. Data destined for the defective cell is written to a repair cell when the external tag memory indicates the write is destined for a defective cell.

Figure 1:
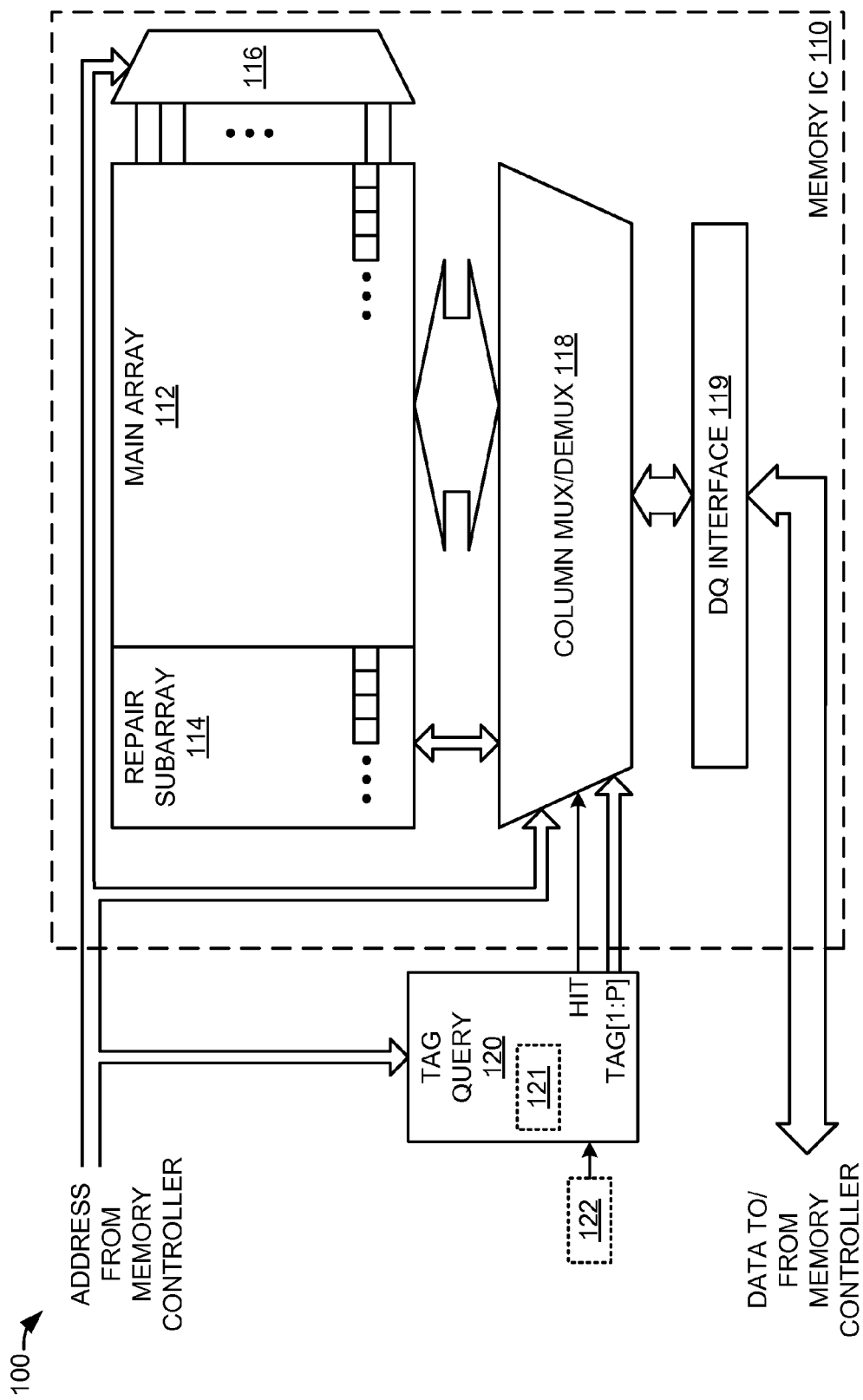
FIG. 1 is a block diagram illustrating a memory system.

FIG. 1 is a block diagram illustrating a memory system. Memory system 100 comprises memory integrated circuit (IC) 110 and tag query 120. Memory system 100 may optionally include a tag memory 122 that is external to tag query 120. Tag query may optionally include a tag memory 121 that is internal to tag query 120. In other words, a tag memory (121 or 122) is located internal to tag query 120, external to tag query 120, or both—but at least one of an internal tag memory 121 or an external tag memory 122 is included in memory system 100, and/or one of its components. In an embodiment, tag memory 121 and/or tag memory 122 may be nonvolatile type memory (e.g., flash). Tag memory 121 and/or tag memory 122 may have their contents copied to temporary (i.e., volatile) memory that is used by tag query 120 to perform one or more functions of tag query 120.

Memory IC 110 includes main memory cell array (main array) 112, repair memory cell array (repair subarray) 114, row decoder 116, column multiplexor/demultiplexor (mux/demux) 118, and data (DQ) interface 119. A first portion of an address from a memory controller is operatively coupled to row decoder 116. A second portion of the address from the memory controller is operatively coupled to column mux/demux 118.

The first portion of the address is decoded by row decoder 116 to activate (select) a row of memory cells in main array 112 and repair subarray 114. The data output from the selected row of memory cells in main array 112 is operatively coupled to column mux/demux 118. The data output from the selected row of memory cells in repair subarray 112 is operatively coupled to column mux/demux 118. Column mux/demux 118 is also operatively coupled to tag query 120 via a HIT signal and one or more TAG[1:P] signal(s), where P>=1. Column mux/demux 118 is also operatively coupled to DQ interface 119. DQ interface 119 is operatively coupled to the memory controller or other device (not shown in FIG. 1).

The address from the memory controller is also operatively coupled to tag query 120. In response to an address from the memory controller, tag query 120 determines whether the address from the memory controller corresponds to an address stored in tag memory 121 and/or tag memory 122, as the case may be. Tag query 120 can function in a content-addressable manner (e.g., as a content addressable memory). If the address from the memory controller corresponds to a stored address, it may be referred to as a "hit" or "tag hit." If the address from the memory controller does not corresponds to a stored address, it may be referred to as a "miss" or "tag miss." In the case of a tag hit, tag query 120 outputs that information in the form of an indicator to memory IC 110 (e.g., an asserted HIT signal.) In the case of a tag miss, tag query 120 outputs that information in the form of an indicator to memory IC 110 (e.g., a deasserted HIT signal.)

For a read operation, when memory IC 110 receives the indication of a tag miss, the data from main array 112 is multiplexed by column mux/demux 118 down to the width of DQ interface 119 without using the data from repair subarray 114. The multiplexed data from column mux/demux 118 may then be output to the memory controller by DQ interface 119.

For a read operation, when memory IC 110 receives the indication of a tag hit, column mux/demux 118 selects one or more bits of data from repair subarray 114 to replace one or more selected bits received from main array 112. The one or more bits selected by column mux/demux 118 is based on information received from tag query 120 (e.g., via one or more TAG[1:P] signals.) The data from main array 112 (minus the bits selected to be replaced) and the data selected from repair subarray 114 as replacement bits are multiplexed by column mux/demux 118 down to the width of DQ interface 119. The multiplexed data from column mux/demux 118 may then be output to the memory controller by DQ interface 119. Accordingly, the data output to the memory controller by DQ interface 119 includes selected bits from repair subarray 114 in place of selected bits from main array 112.

For a write operation, when memory IC 110 receives the indication of a tag miss, the data from the memory controller received by DQ interface 119 is demultiplexed by column mux/demux 118 up to the width of a row of main array 112. An entire row of main array 112 may then be written to main array 112. During the same row write operation, dummy or redundant data may or may not be written to repair subarray 114.

For a write operation, when memory IC 110 receives the indication of a tag hit, the data from the memory controller received by DQ interface 119 is demultiplexed by column mux/demux 118 up to the width of a row of main array 112. This can include the one or more columns of main array 112 that are indicated by tag query 120 to correspond to the tag hit. One or more bits of the data from the memory controller received by DQ interface 119 are also demultiplexed into one or more bits of a row of repair subarray 114. The one or more bits selected by column mux/demux 118 and sent to repair subarray 114 is based on information received from tag query 120 (e.g., via one or more TAG[1:P] signals.)

An entire row of main array 112 is written to main array 112—including the one or more columns of main array 112 that are indicated by tag query 120 to correspond to the tag hit (optionally with arbitrary data). Likewise, during the same row write operation, the one or more bits selected by column mux/demux 118 and sent to repair subarray 114 are written to repair subarray 114.

It should be understood that the addresses stored in tag memory 121 and/or tag memory 122 (as the case may be), which are external to memory IC 110, can cause a write to be duplicated to the repair subarray, and a read to be satisfied from the repair subarray. The same address stored in the tag memory (121 and/or 122) which causes a write to be duplicated to a certain location in repair array 114 causes reads from that address to be satisfied from that same certain location in repair array 114. Thus, read and write accesses to addresses stored in the tag memory (121 and/or 122) are satisfied by repair array 114. Accordingly, when addresses stored in the tag memory (121 and/or 122) correspond to defective cells in main array 112, the defective cells in main array 112 are functionally (i.e., effectively) replaced by cells in repair subarray 114. Since the addresses stored in the external to memory IC 110 tag memory (121 and/or 122) can correspond to a single cell, the effective replacement of cells can be accomplished on a cell-by-cell basis—rather than a whole row or whole column.

It should also be understood that repair subarray 114 can be accessed at the same time, and with the same timing, as main array 112. Thus, the read and write timing of repair subarray 114 and main array 112 can be the same. Tag query 120 has until the data is received from main array 112 and repair subarray to provide the HIT and TAG[1:P] signals to memory IC 110. This provides tag query 120 with the entire access cycle time of memory IC 110 to perform tag lookup and provide the HIT and TAG[1:P] signals to memory IC 110.

Figure 2:
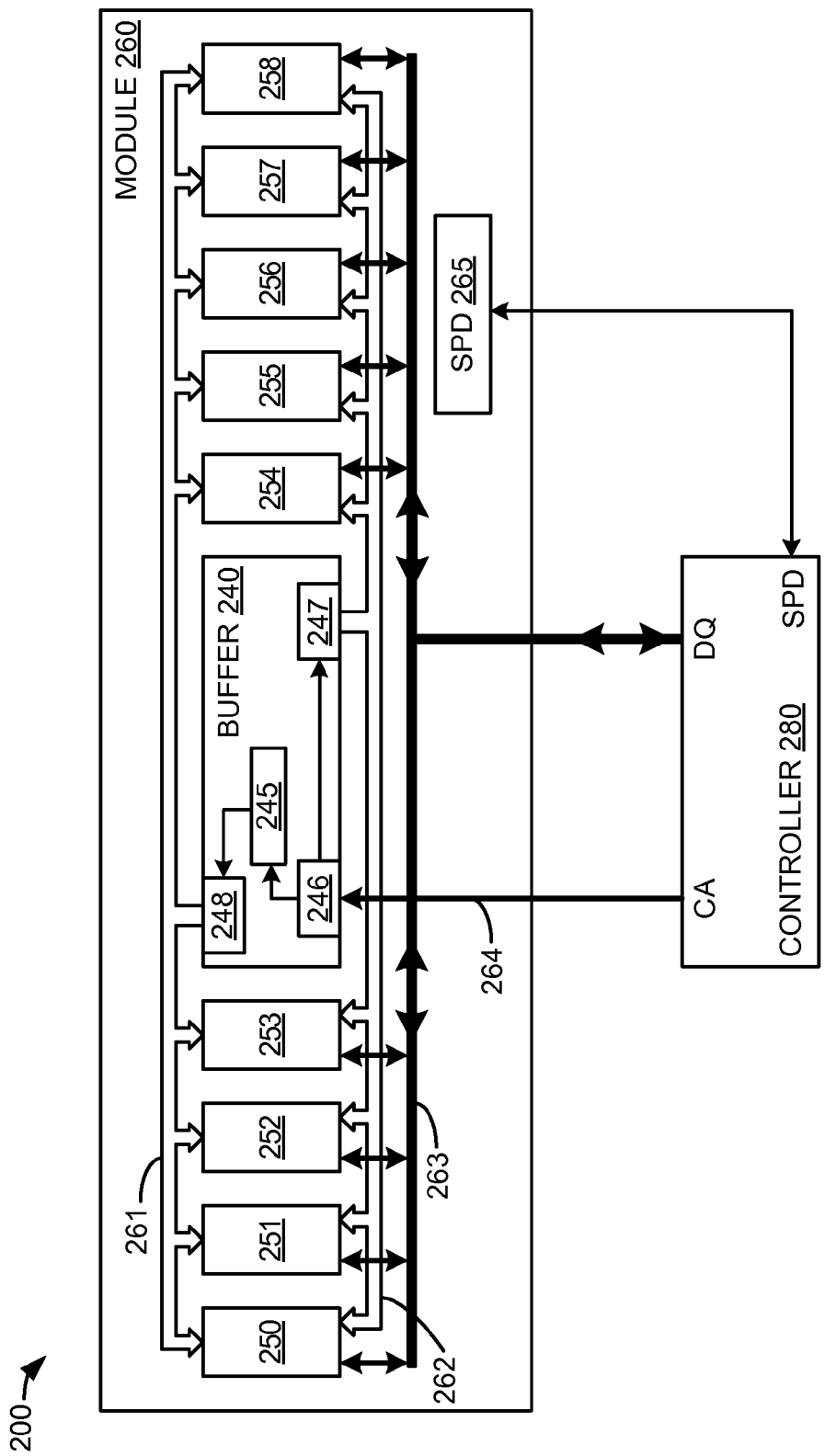
FIG. 2 is a block diagram illustrating a memory module based system.

FIG. 2 is a block diagram illustrating a memory module based system. In FIG. 2, system 200 comprises controller 280 and memory module 260. Module 260 includes buffer integrated circuit 240, a rank of memory comprising memory devices 250-258, DQ connections 263, command/address (CA) bus 264, buffered CA bus 262, secondary CA bus 261, and serial presence detect (SPD) 265. CA bus 264 is operatively coupled between buffer 240 and controller 280. DQ connections 263 are operatively coupled between controller 280 and each of memory devices 250-258. Buffered CA bus 262 is operatively coupled between buffer 240 and each of memory devices 250-258. Secondary CA bus 261 is operatively coupled between buffer 240 and each of memory devices 250-258. SPD is operatively coupled to controller 280.

Memory device 250-258 may function like memory IC 110, described herein. For example, the address from memory controller may correspond to buffered CA bus 262. The HIT and TAG[1:P] signals may correspond to signals received via secondary CA bus 261.

Buffer 240 includes tag query 245, CA input interface 246, CA output interface 247, and secondary CA bus interface 248. CA input interface 246 is operatively coupled to CA bus 264 to receive CA signals from controller 280. CA output interface 247 is operatively coupled to buffered CA bus 262. CA input interface 246 is operatively coupled to CA output interface 247 so that CA output interface 247 may output buffered CA signals to each of memory devices 250-258 via buffered CA bus 262.

CA input interface 246 is operatively coupled to tag query 245. Tag query 245 is operatively coupled to secondary CA bus 261. In response to an address from CA interface 246, tag query 245 determines whether the address from the memory controller corresponds to an address stored in a tag memory (not shown in FIG. 2). If there is a tag miss, tag query 245 sends, via secondary CA bus 261, an indicator that none of memory devices 250-258 should utilize (in the case of a read) or send (in the case of a write) data from/to their internal repair arrays (not shown in FIG. 2). If there is a tag hit, tag query 245 sends an indicator that at least one of memory devices 250-258 should utilize or send data from/to their internal repair array. Tag query 245 also sends, via secondary CA bus 261, one or more indicators which specify which of memory devices 250-258 should utilize or send data from/to their internal repair array. Tag query 245 also sends, via secondary CA bus 261, one or more indicators (e.g., addresses) which provide the information needed by the specified memory devices 250-258 to replace one or more indicated memory cells with memory cells in their internal repair array.

Figure 3:
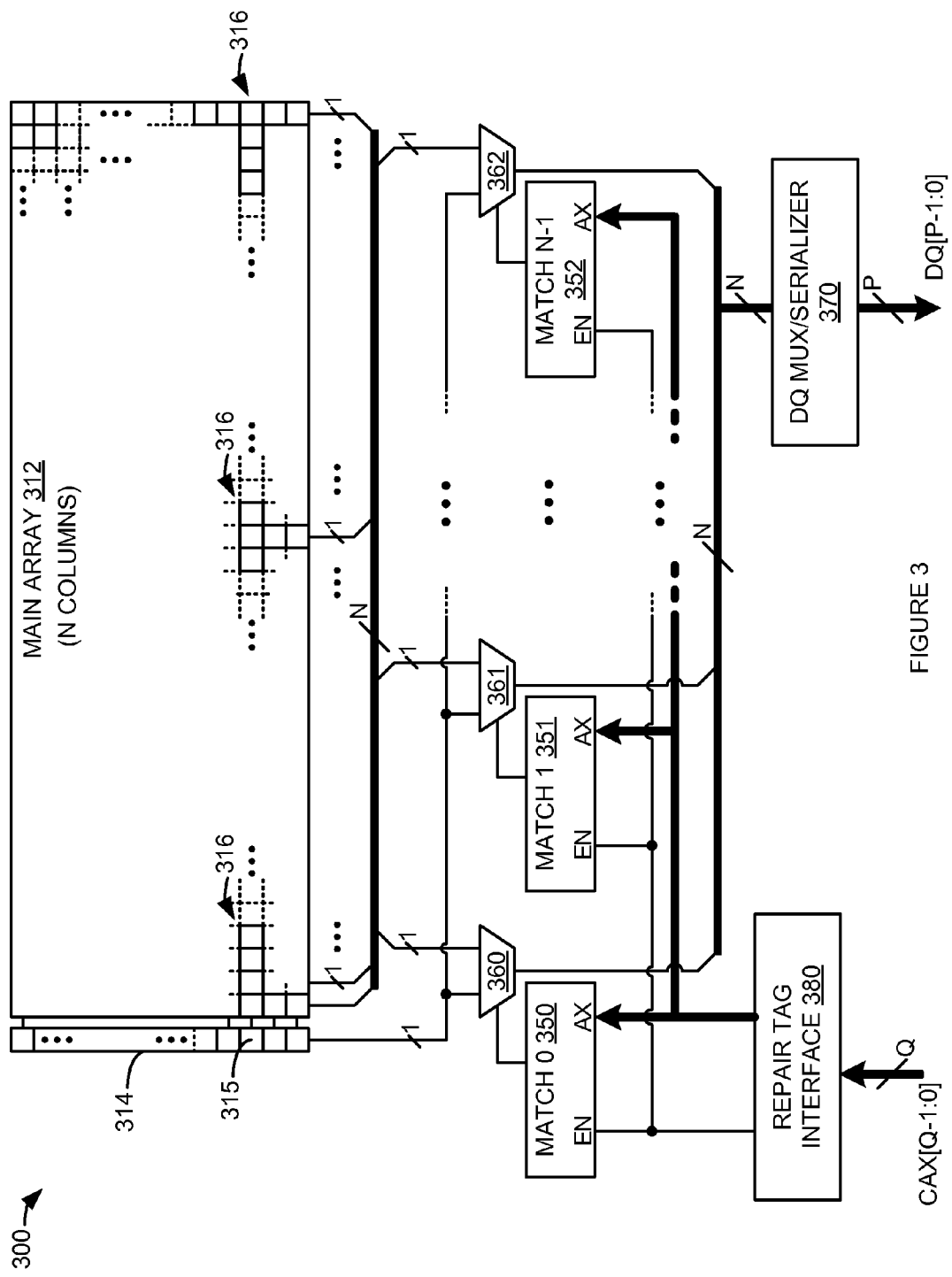
FIG. 3 is a block diagram illustrating a memory read configuration.

FIG. 3 is a block diagram illustrating a memory read configuration. The configuration shown in FIG. 3 may correspond to the functioning of memory IC 110 and/or memory devices 250-258 during read accesses. Memory 300 comprises main array 312, repair array 314, decoders 350-352, 2:1 multiplexors 360-362, DQ multiplexor/serializer 370, and repair tag interface 380. Main array 312 comprises a plurality of memory tiles 316 arranged in a 2-dimensional array having N number of columns. In an embodiment, repair array 314 comprises a plurality of memory tiles 315 arranged into one column and the same number of rows as main array 312. Repair tag interface 380 receives an address and "hit" indicator from external tag query circuitry (not shown in FIG. 3). In FIG. 3, the address and "hit" indicator comprise Q number of signals CAX[Q-1:0]. DQ Mux/serializer 370 outputs P number of data signals DQ[P-1:0].

In FIG. 3, multiplexors 360-362 represent N number of multiplexors. Each of multiplexors 360-362 is configured to receive, at a first input, the same 1 bit from repair array 314. Each of multiplexors 360-362 is also configured to each receive a different one of N bits from main array 312. In other words, each of multiplexors 360-362 is configured to receive one bit from a unique one of the N columns of main array 312. The selection by multiplexor 360-362 of either the 1 bit from repair array 314 versus the bit from main array 312 is controlled by a corresponding respective one of decoders 350-352. Each of decoders 350-352 (a.k.a., Match 0, Match 1, . . . Match N-1) is configured to receive an address from repair tag interface 380, and an enable signal. If the enable signal is asserted, and the address received from repair tag interface 380 matches the respective decoder 350-352's address (i.e., the address 0 matches decoder 350, the address 1 matches decoder 351, and so on), the respective decoder 350-352 controls the corresponding multiplexor 360-362 to output the 1 bit received from repair array 314. If the enable signal is not asserted, or the address received from repair tag interface 380 does not match the respective decoder 350-352's address, the respective decoder 350-352 controls the corresponding multiplexor 360-362 to output the bit it received from main array 312. The N number of bits output by the N number of multiplexors 360-362 are provided to DQ mux/serializer 370. DQ mux/serializer 370 outputs P number of bits at a time.

Figure 4:
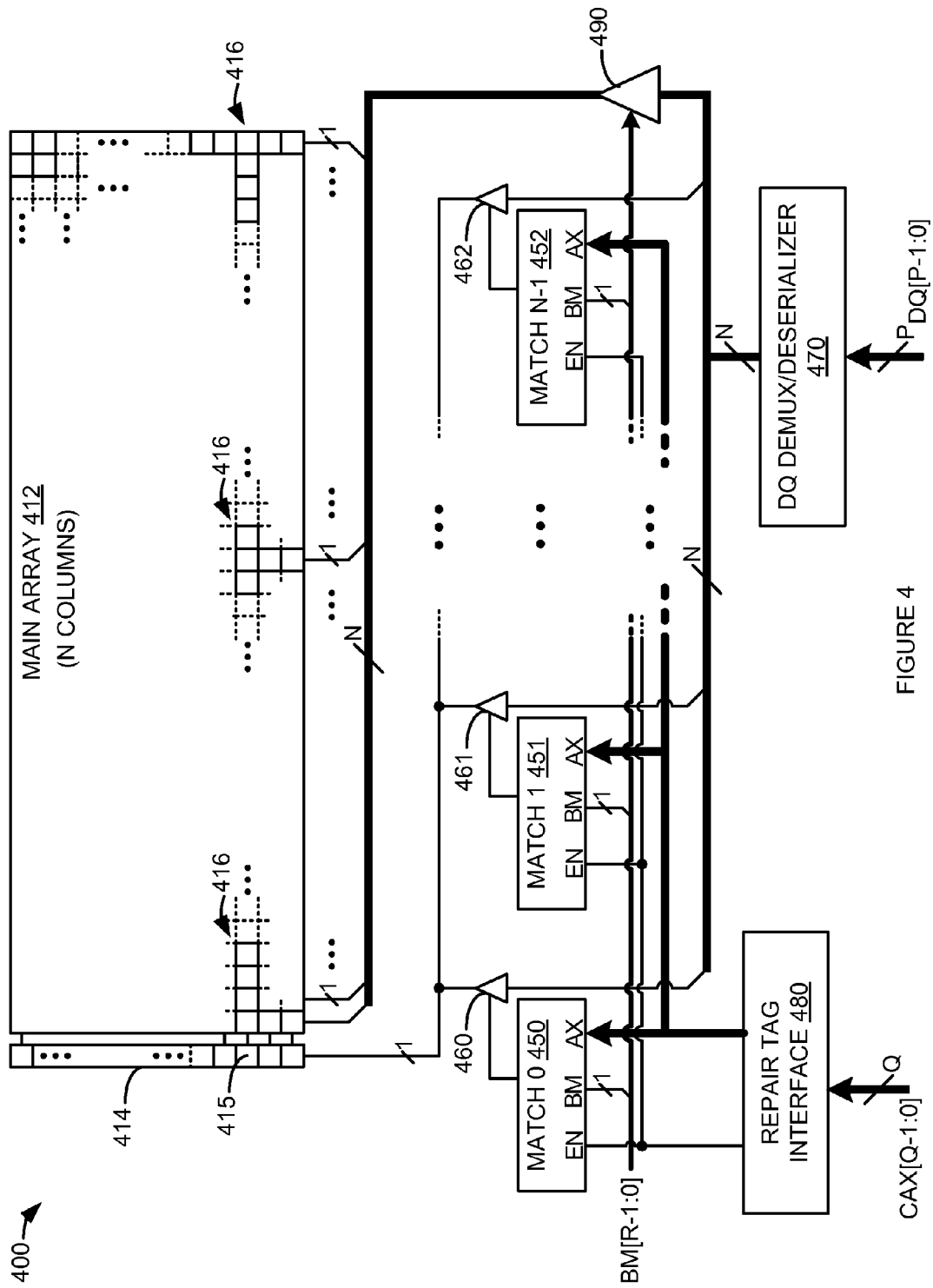
FIG. 4 is a block diagram illustrating a memory write configuration.

FIG. 4 is a block diagram illustrating a memory write configuration. The configuration shown in FIG. 4 may correspond to the functioning of memory IC 110 and/or memory devices 250-258 during write accesses. Memory 400 comprises main array 412, repair array 414, decoders 450-452, tri-state buffers 460-462, DQ demultiplexor/deserializer 470, repair tag interface 480, and mask buffers 490. Main array 412 comprises a plurality of memory tiles 416 arranged in a 2-dimensional array having N number of columns. In an embodiment, repair array 414 comprises a plurality of memory tiles 415 arranged into one column and the same number of rows as main array 412. Repair tag interface receives an address and "hit" indicator from external tag query circuitry (not shown in FIG. 4). In FIG. 4, the address and "hit" indicator comprise Q number of signals CAX[Q-1:0]. DQ demux/deserializer 470 receives P number of data signals DQ[P-1:0] in parallel.

In FIG. 4, tri-state buffers 460-462 represent N number of tri-state buffers. Tri-state buffers 460-462 are configured to receive, at an input, the 1 of N bits output by DQ demux/deserializer 470. Each of tri-state buffers 460-462 is configured to each receive a different one of the N bits output by DQ demux/deserializer 470. In other words, each of tri-state buffers 460-462 is configured to receive a unique one bit from DQ demux/deserializer 470. The output by a tri-state buffer 460-462 of either the 1 bit from DQ demux/ deserializer 470 versus remaining in a high-impedance (tri-state) condition is controlled by a corresponding respective one of decoders 450-452. Each of decoders 450-452 (a.k.a., Match 0, Match 1, . . . Match N-1) is configured to receive an address from repair tag interface 480, an enable signal, and a byte mask signal (BM). If the enable signal is asserted, the byte mask signal is not asserted, and the address received from repair tag interface 480 matches the respective decoder 450-452's address (i.e., the address 0 matches decoder 450, the address 1 matches decoder 451, and so on), the respective decoder 450-452 controls the corresponding tri-state buffer 460-462 to output the 1 bit it received from DQ demux/deserializer 470. If the enable signal is not asserted, the byte mask signal is asserted, or the address received from repair tag interface 480 does not match the respective decoder 450-452's address, the respective decoder 450-452 controls the corresponding tri-state buffer 460-462 to remain in a high-impedance state.

All of the outputs of tri-state buffers 460-462 are connected together and operatively coupled to repair array 414. Since all of the outputs of tri-state buffers 460-462 are connected together, and each decoder 450-452 corresponds to a unique one of N addresses, it should be understood that decoders 450-452 and tri-state buffers 460-462 function as an N:1 multiplexor. The output of the N:1 multiplexor formed by decoders 450-452 and tri-state buffers 460-462 is coupled to repair array 414 so that the bit selected by the N:1 multiplexor is written to repair array 414 during a write access to main array 412.

The R number of byte mask signals B[R-1:0] also control N number of mask buffers 490. Mask buffers 490 implement the functionality that prevents certain bytes from being written to main array 412. The bytes overwritten in main array 412 by new data correspond to those bits that have a mask signal B[R-1:0] deasserted. Likewise, if the bit to be written to repair array 414 corresponds to a bit that has a mask signal B[R-1:0] deasserted, the bit will be overwritten in repair array 414 by the data on the output of the selected tri-state buffer 460-462. If the bit to be written to repair array 414 corresponds to a bit that has a mask signal B[R-1:0] asserted, the bit will not be overwritten in repair array 414 by the data on the output of the selected tri-state buffer 460-462 because the outputs of tri-state buffer 460-462 will all remain undriven.

Figure 5:
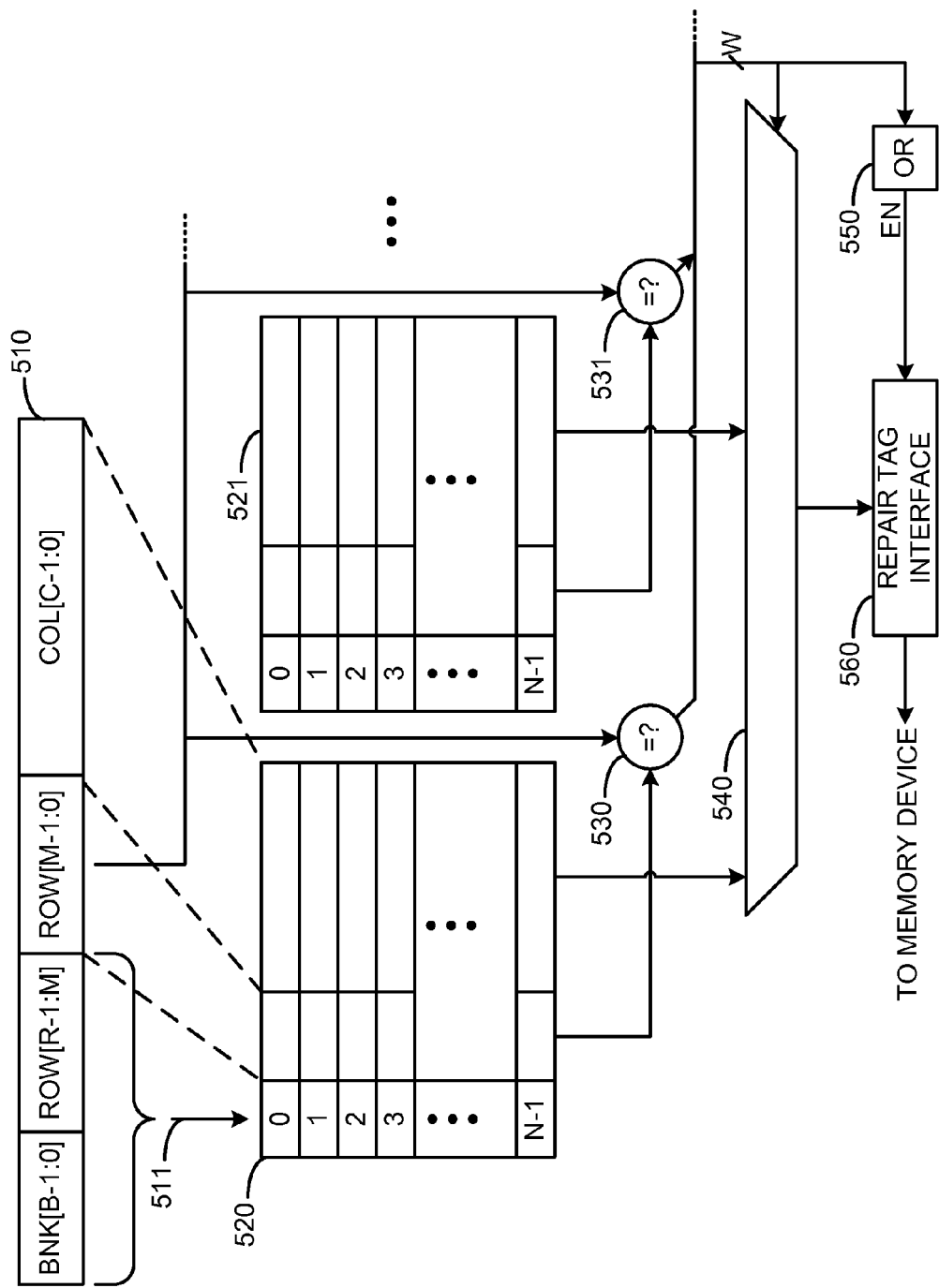
FIG. 5 is a block diagram illustrating repair tag lookup.

FIG. 5 is a block diagram illustrating repair tag lookup. A complete tag query address 510 is looked up. Tag query address 510 includes B number of bits of bank address, R number of bits of row address, and C number of bits of column address. In FIG. 5, Tag memories 520-521 represent W number of tag memories, where W is greater than or equal to one. Thus, FIG. 5 illustrates a W-way associative tag lookup.

Tag memories 520-521 store N number of tag entries that are addressed 0 through N-1. Each of the N tag entries stores a partial address 510. The partial address stored by tag memory 520-521 includes M bits of row address (i.e., ROW[M-1:0]) and C bits of column address (i.e., COL[C-1:0]). Each tag entry may also store an indicator of the validity of the entry (e.g., a "valid" bit).

In the example shown in FIG. 5, each of the N tag entries stores C bits of a column address and M bits of a row address. The rest of the query address 510 is used as an index 511 into tag memory 520-521. In other words, the bank address BNK[B-1:0] and a part of the row address ROW[R-1:M] of query address 510 are used to address one of the N tag entries stored in tag memory 520 and tag memory 521. As a result of being addressed by the partial tag query address 511, tag memories 520-521 output the contents of the tag entry corresponding to the partial tag query address 511. In other words, tag memories 520-521 each may output the M bits of row address and the C bits of column address that is stored at the location corresponding to the partial tag query address 511. A partial output of tag memories 520-521 is compared to the corresponding portion of tag query address 510 by comparators 530-531, respectively. For example, the M bits of row address may be compared to the corresponding M bits of tag query address 510.

If the output of a comparator 530-531 indicates a match between the entry stored in a tag memory 520-521 and the tag query address, it indicates a tag hit. The indication of the tag hit causes multiplexor 540 to provide repair tag interface 560 with the information necessary to repair the cell associated with that entry in tag memory 520-521. In FIG. 5, this information is illustrated as the column address COL[C−1:0]. Repair tag interface provides this information to a memory device—for example, memory IC 110. It should be understood that FIG. 5 shows an example implementation of tag query functionality. However, other implementations, such as a content-addressable-memory, are possible.

Figure 6:
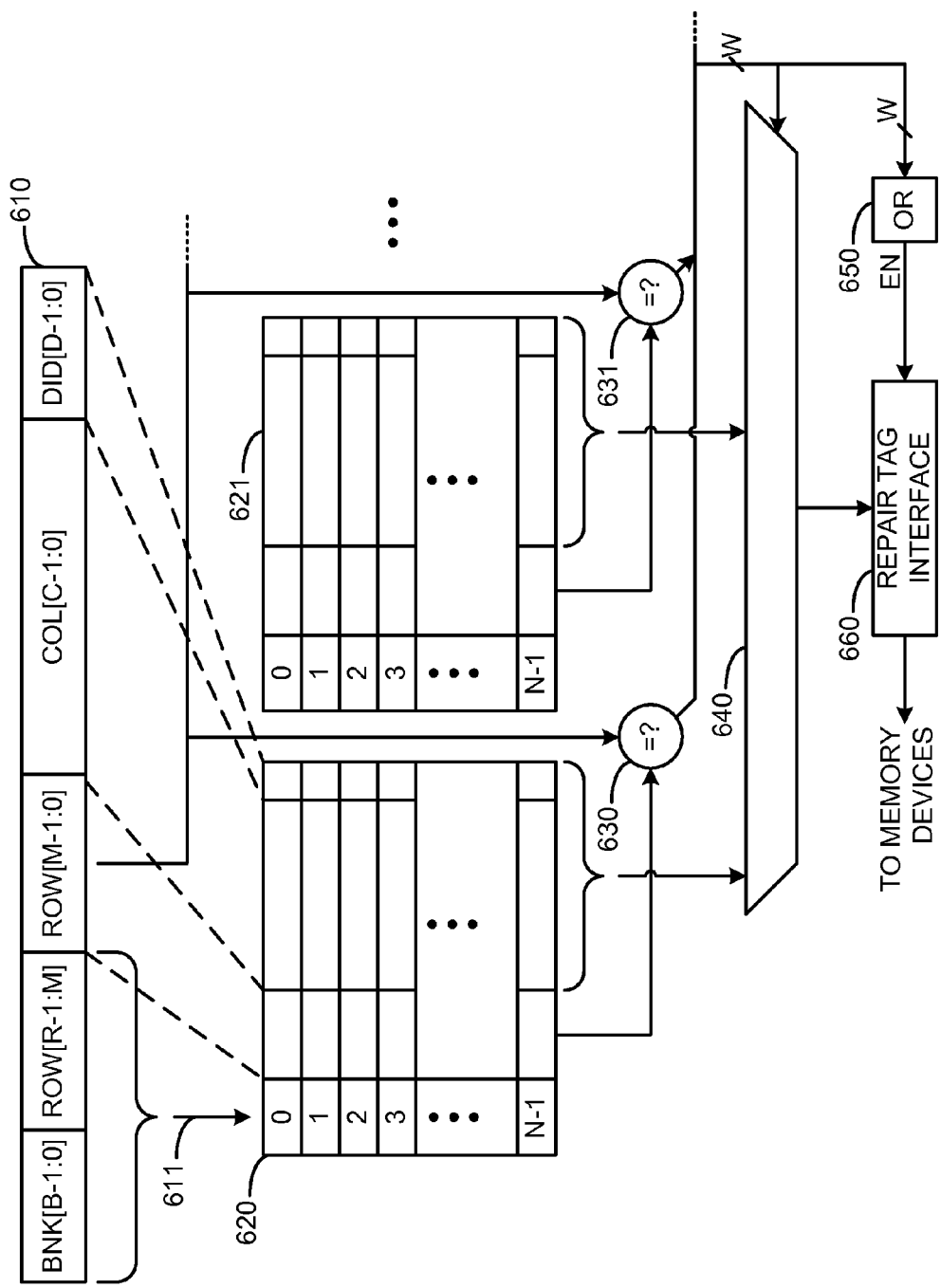
FIG. 6 is a block diagram illustrating a multi-device repair tag lookup.

FIG. 6 is a block diagram illustrating a multi-device repair tag lookup. A complete tag query address 610 is looked up. Tag query address 610 includes B number of bits of bank address, R number of bits of row address, C number of bits of column address, and D number of bits of device identification (device ID). In FIG. 5, Tag memories 620-621 represent W number of tag memories, where W is greater than or equal to one. Thus, FIG. 6 illustrates a W-way associative tag lookup.

Tag memories 620-621 store N number of tag entries that are addressed 0 through N−1. Each of the N tag entries stores a partial address 610. The partial address stored by tag memory 620-621 includes M bits of row address (i.e., ROW[M−1:0]) and C bits of column address (i.e., COL[C−1]:0). Each tag entry may also store an indicator of the validity of the entry.

In the example shown in FIG. 6, each of the N tag entries stores C bits of a column address, M bits of a row address, and D bits of device ID. The rest of the query address 610 is used as an index into tag memory 620-621. In other words, the bank address BNK[B−1:0] and a part of the row address ROW[R−1:M] of query address 610 are used to address one of the N tag entries stored in tag memory 620 and tag memory 621. As a result of being addressed by the partial tag query address 611, tag memories 620-621 output the contents of the tag entry corresponding to the partial tag query address 611. In other words, tag memories 620-621 each may output the M bits of row address, the C bits of column address, and the D bits of device ID that is stored at the location corresponding to the partial tag query address 611. A partial output of tag memories 620-621 is compared to the corresponding portion of tag query address 610 by comparators 630-631, respectively. For example, the M bits of row address may be compared to the corresponding M bits of tag query address 610.

If the output of a comparator 630-631 indicates a match between the entry stored in a tag memory 620-621 and the tag query address, it indicates a tag hit. The indication of the tag hit causes multiplexor 640 to provide repair tag interface 660 with the information necessary to repair the cell associated with that entry in tag memory 620-621. In FIG. 6, this information is illustrated as the column address COL[C−1:0] and the device ID D[D−1:0]. Repair tag interface provides this information to at least one memory device—for example, memory devices 250-258. The device ID portion of this information may be used by memory devices 250-258 to determine which of memory devices 250-258 should utilize its repair array, as described herein. It should be understood that FIG. 6 shows an example implementation of tag query functionality. However, other implementations, such as a content-addressable-memory, are possible.

Figure 7:
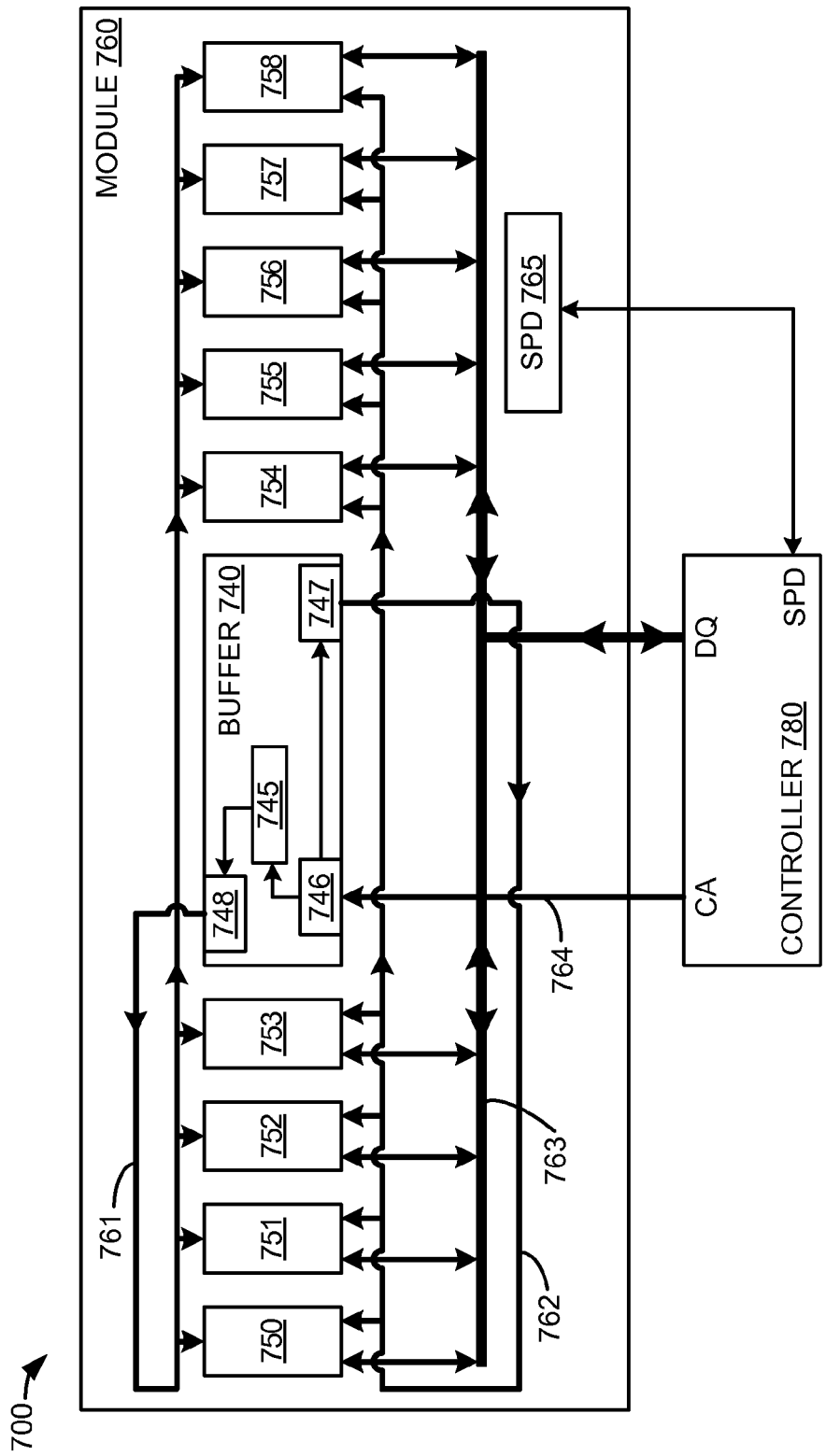
FIG. 7 is a block diagram illustrating a memory module system.

FIG. 7 is a block diagram illustrating a memory module system. In FIG. 7, system 700 comprises controller 780 and memory module 760. Module 760 includes buffer integrated circuit 740, a rank of memory comprising memory devices 750-758, DQ connections 763, command/address (CA) bus 764, buffered CA bus 762, secondary CA bus 761, and serial presence detect (SPD) 765. CA bus 764 is operatively coupled between buffer 740 and controller 780. DQ connections 763 are operatively coupled between controller 780 and each of memory devices 750-758. Buffered CA bus 762 is operatively coupled between buffer 740 and each of memory devices 750-758. Secondary CA bus 761 is operatively coupled between buffer 740 and each of memory devices 750-758. SPD is operatively coupled to controller 780.

In an embodiment, buffered CA bus 762 is routed in a fly-by configuration. In other words, buffered CA bus 762 is routed to memory device 750 first, memory device 751 second, and so on through memory device 758. Secondary CA bus 761 is also routed in a fly-by configuration. That is, Secondary CA bus 761 is routed to memory device 750 first, memory device 751 second, and so on through memory device 758. It should be understood that by routing both buffered CA bus 762 and secondary CA bus 761 in the same manner (i.e., in a fly-by configuration), secondary CA bus 761 may use the same timing and clock signaling as buffered CA bus 762. Thus, memory devices 750-758 can receive secondary CA bus 761 signals without additional clock signal(s) dedicated to secondary CA bus 761. However, secondary CA bus 761 may have clock signal(s) dedicated to secondary CA bus 761. In an embodiment, secondary CA bus 761 transmits information in a serial manner.

Memory device 750-758 may function like memory IC 110 and memory devices 250-258, described herein. For example, the address from memory controller may correspond to buffered CA bus 762. The HIT and TAG[1:P] signals may correspond to signals received via secondary CA bus 761.

Buffer 740 includes tag query 745, CA input interface 746, CA output interface 747, and secondary CA bus interface 748. CA input interface 746 is operatively coupled to CA bus 764 to receive CA signals from controller 780. CA output interface 747 is operatively coupled to buffered CA bus 762. CA input interface 746 is operatively coupled to CA output interface 747 so that CA output interface 747 may output buffered CA signals to each of memory devices 750-758 via buffered CA bus 762.

CA input interface 746 is operatively coupled to tag query 745. Tag query 745 is operatively coupled to secondary CA bus 761. In response to an address from CA interface 746, tag query 745 determines whether the address from the memory controller corresponds to an address stored in a tag memory (not shown in FIG. 7). If there is a tag miss, tag query 745 sends, via secondary CA bus 761, an indicator that none of memory devices 750-758 should utilize (in the case of a read) or send (in the case of a write) data from/to their internal repair arrays (not shown in FIG. 7). If there is a tag hit, tag query 745 sends an indicator that at least one of memory devices 750-758 should utilize or send data from/to their internal repair array. Tag query 745 also sends, via secondary CA bus 761, one or more indicators which specify which of memory devices 750-758 should utilize or send data from/to their internal repair array. Tag query 745 also sends, via secondary CA bus 761, one or more indicators (e.g., addresses) which provide the information needed by the specified memory devices 750-758 to replace one or more indicated memory cells with memory cells in their internal repair array.

In an embodiment, tag query sends these indicator via secondary CA bus 761 using serial links. In other words, the one or more indicators (e.g., addresses) which provide the information needed by the specified memory devices 750-758 to replace one or more indicated memory cells with memory cells in their internal repair array are sent serially (on one or more signal lines) during the cycle time of memory devices 750-758. This allows secondary CA bus 761 to have significantly fewer signal lines than buffered CA bus 762 and/or CA bus 764.

Figure 8:
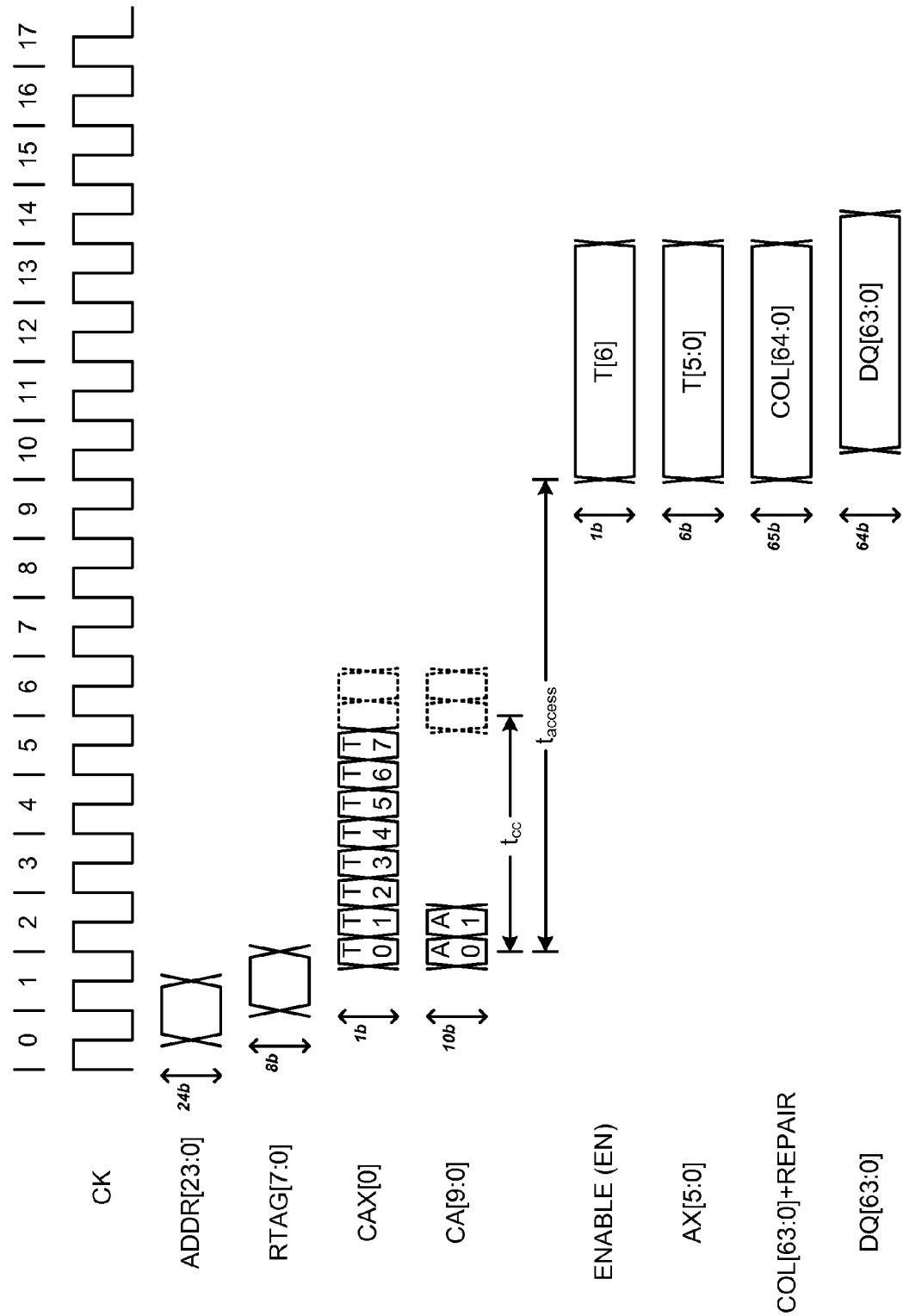
FIG. 8 is a timing diagram illustrating a memory read with repair tags.

FIG. 8 is a timing diagram illustrating a memory read with repair tags. FIG. 8 illustrates exemplary timing and signals that may be exchanged in system 300 and/or system 700. In FIG. 8, a first timing reference CK is shown periodically toggling at a stable cycle period. Each phase of CK corresponds to one bit period (a.k.a., unit interval) on the links of CA bus 764, buffered CA bus 762, and secondary CA bus 761. In FIG. 8, CK is shown as a receive clock for the links of CA bus 764, buffered CA bus 762, and secondary CA bus 761. In other words, the edges of CK are shown to occur during the stable periods of the links of CA bus 764, buffered CA bus 762, and secondary CA bus 761. However, it should be understood that this is merely illustrative and other timing relationships and other clocks are possible. Also, for reference, in FIG. 8, the cycles of CK are number 0 through 17 with each cycle beginning on the rising edge of CK. FIG. 8 illustrates the case where there is a tag hit.

In FIG. 8, a 24-bit address (ADDR[23:0]) is received on the rising edge of CK cycle #1. This address is supplied to, for example, tag query 745. In response, one-half cycle later, a tag query (e.g., tag query 745) outputs 8 bits of repair tag RTAG[7:0]. Starting with the rising edge of CK cycle #2, the bits of the repair tag (shown in FIG. 8 as T0-T7) are output serially at one bit per edge of CK. The T[7:0] are received serially at memory devices (after some propagation delay), in order T[0] through T[7] at one bit per edge of CK. Also starting with the rising edge of CK cycle #2, ten bits of command/address (shown in FIG. 8 as A0 and A1) are received. The receipt of A0 starts a column cycle time ($t_{cc}$). At the end of the column cycle time, a new command/address and associated tags may be received. In FIG. 8, this is shown as 4 CK cycles (8 CK edges). However, it should be understood that this is exemplary and that $t_{cc}$ may consist of other numbers of CK cycles.

The receipt of A0 also starts a column access time ($t_{access}$). The column access time is a time from the edge used to receive A0 to the edge where data is valid at the outputs of the main array and the repair array (shown as COL[63:0]+REPAIR in FIG. 8). In FIG. 8, this is shown as 8 CK cycles (16 CK edges). Also shown in FIG. 8 is the validity of the enable signal (EN-T[6]) and the repair tags T[5:0] being received at the EN and AX inputs of the decoder blocks, respectively (e.g., decoder blocks 350-352). A short delay (e.g., gate delay of multiplexers 360-362) after data is valid at the outputs of the main array and the repair array, data with a repair bit substituted for the bit indicated by the repair tag is ready to be output by the system (e.g., the data is valid at DQ mux/serializer 370). This is shown in FIG. 8 as the validity of the DQ[63:0] signals.

Figure 9:
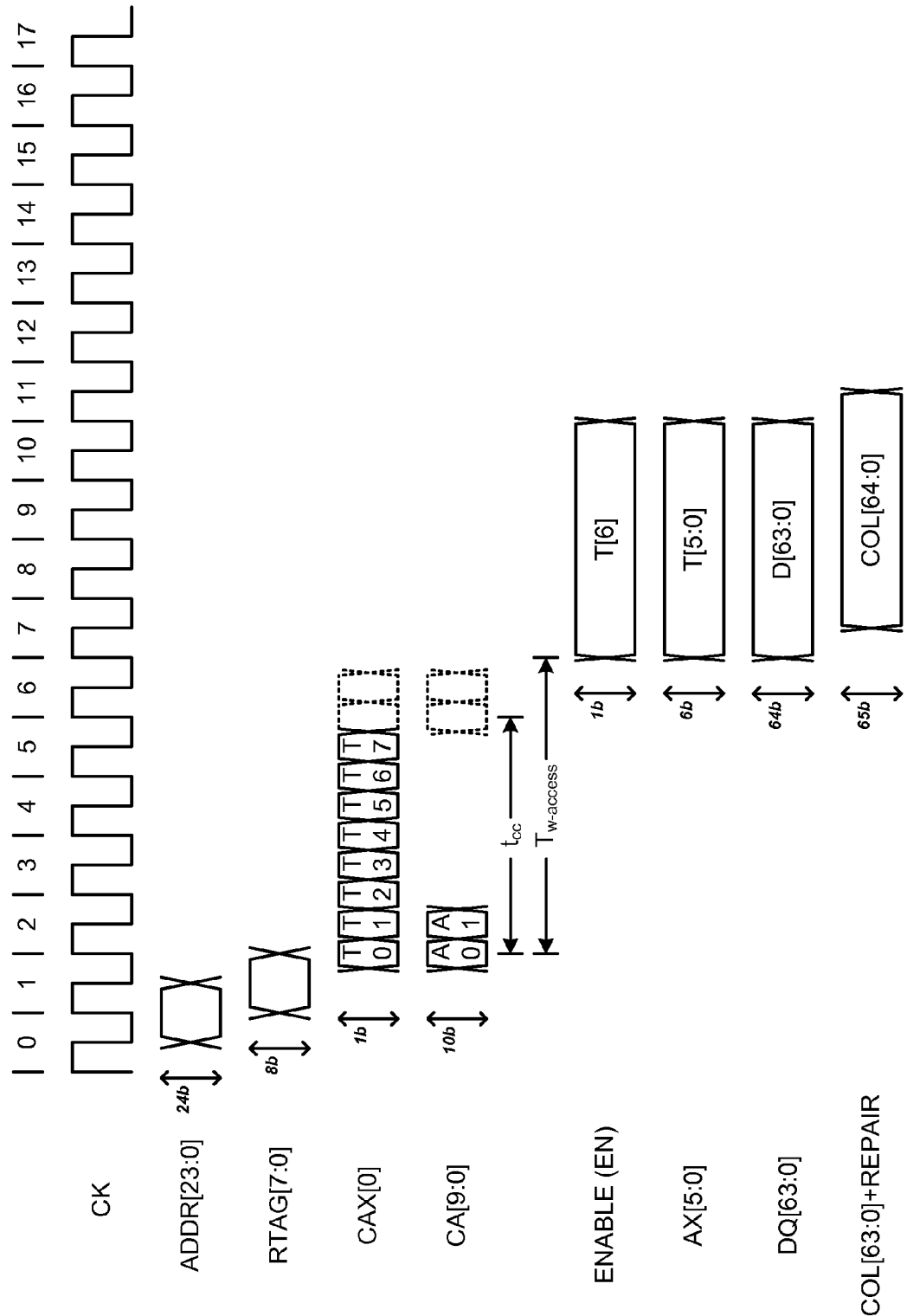
FIG. 9 is a timing diagram illustrating a memory write with repair tags.

FIG. 9 is a timing diagram illustrating a memory write with repair tags. FIG. 9 illustrates exemplary timing and signals that may be exchanged in system 400 and/or system 700. In FIG. 8, a first timing reference CK is shown periodically toggling at a stable cycle period. Each phase of CK corresponds to one bit period (a.k.a., unit interval) on the links of CA bus 764, buffered CA bus 762, and secondary CA bus 761. In FIG. 9, CK is shown as a receive clock for the links of CA bus 764, buffered CA bus 762, and secondary CA bus 761. In other words, the edges of CK are shown to occur during the stable periods of the links of CA bus 764, buffered CA bus 762, and secondary CA bus 761. However, it should be understood that this is merely illustrative and other timing relationships other clocks are possible. Also, for reference, in FIG. 9, the cycles of CK are number 0 through 17 with each cycle beginning on the rising edge of CK. FIG. 9 illustrates the case where there is a tag hit.

In FIG. 9, a 24-bit address (ADDR[23:0]) is received on the rising edge of CK cycle #1. This address is supplied to, for example, tag query 745. In response, one-half cycle later, a tag query (e.g., tag query 745) outputs 8 bits of repair tag RTAG[7:0]. Starting with the rising edge of CK cycle #2, the bits of the repair tag (shown in FIG. 8 as T0-T7) are output serially at one bit per edge of CK. The T[7:0] are received serially at memory devices (after some propagation delay), in order T[0] through T[7] at one bit per edge of CK. Also starting with the rising edge of CK cycle #2, ten bits of command/address (shown in FIG. 9 as A0 and A1) are received. The receipt of A0 starts a column cycle time ($t_{cc}$). At the end of the column cycle time, a new command/address and associated tags may be received. In FIG. 9, this is shown as 4 CK cycles (8 CK edges). However, it should be understood that this is exemplary and that $t_{cc}$ may consist of other numbers of CK cycles.

The receipt of A0 also starts a column write access time ($t_{w-access}$). The column write access time is a time from the edge used to receive A0 to the edge where data is valid at the inputs of the write mask buffers and repair bit multiplexor (e.g., write mask buffer 490 and tri-state buffers 460-462). In FIG. 9, this is shown as 5 CK cycles (10 CK edges). Also shown in FIG. 9 is the validity of the enable signal (EN-T[6]) and the repair tags T[5:0] being received at the EN and AX inputs of the decoder blocks, respectively (e.g., decoder blocks 450-452). A short delay (e.g., the gate delay of write mask buffer 490 and tri-state buffers 460-462) after data is valid at the inputs of the write mask buffers and repair bit multiplexor, data is ready at the columns of the repair array and the main array (e.g., the data is valid at the columns of main array 412 and repair array 414). This is shown in FIG. 9 as the validity of the COL[63:0]+REPAIR signals.

Figure 10:
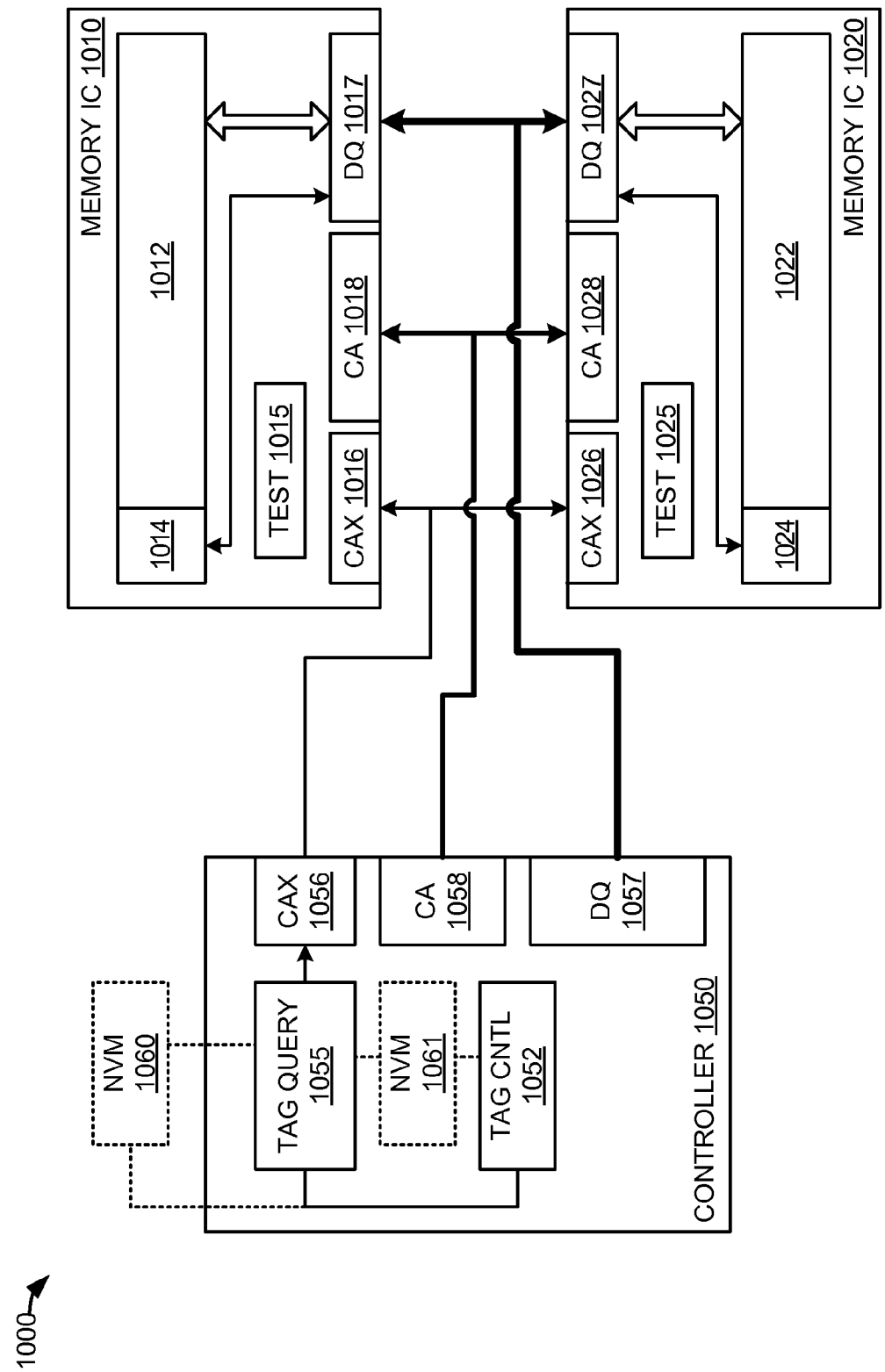
FIG. 10 is a block diagram illustrating a system with controller repair tags.

FIG. 10 is a block diagram illustrating a system with controller repair tags. System 1000 comprises memory IC 1010, memory IC 1020, controller 1050, and optionally external nonvolatile tag memory 1060. Controller 1050 includes tag query 1055, tag control 1052, secondary CA interface (CAX interface) 1056, CA interface 1058, DQ interface 1057, and optionally internal nonvolatile tag memory 1061. Memory IC 1010 includes main array 1012, repair array 1014, test state machine 1015, secondary CA interface (CAX interface) 1016, CA interface 1018, and DQ interface 1017. Memory IC 1020 includes main array 1022, repair array 1024, test state machine 1025, secondary CA interface (CAX interface) 1026, CA interface 1028, and DQ interface 1027.

CAX interface 1056 of controller 1050 is operatively coupled to CAX interface 1016 of memory IC 1010 and to CAX interface 1026 of memory IC 1020. CA interface 1058 of controller 1050 is operatively coupled to CA interface 1018 of memory IC 1010 and to CA interface 1028 of memory IC 1020. DQ interface 1057 of controller 1050 is operatively coupled to DQ interface 1017 of memory IC 1010 and to DQ interface 1027 of memory IC 1020. Tag control 1052 and tag query 1055 are operatively coupled to external nonvolatile memory 1060 and/or internal nonvolatile memory 1061, as appropriate for the presence of external nonvolatile memory 1060 and/or internal nonvolatile memory 1061.

In an embodiment, tests of the functioning and/or performance of memory IC 1010 and/or memory IC 1020 are performed. These tests may include retention test. Retention tests of memory IC 1010 and/or memory IC 1020 may be performed or aided by test state machine 1015 and test state machine 1025, respectively. Retention tests may be performed using an increased time between refreshes of memory IC 1010 and memory IC 1020. This increased time between refreshes may be varied in order to measure the retention time of memory cells.

Retention tests may be performed by test equipment (not shown in FIG. 10) before memory IC 1010 or memory IC 1020 is integrated into system 1000. These retention test may be performed during the manufacturing of memory IC 1010 or memory IC 1020 (e.g., at wafer test, post-packaging, and/or after burn-in). The results of these retention tests performed on memory IC 1010 and/or memory IC 1020 may be used to create and/or update tags that are stored in external nonvolatile tag memory 1060 and/or internal nonvolatile memory 1061, as appropriate.

Retention tests may be performed by controller 1050 once memory IC 1010 and/or memory IC 1020 is integrated into system 1000. The results of these retention tests performed after memory IC 1010 and/or memory IC 1020 has been coupled to controller 1050 may be used to create and/or update tags that are stored in external nonvolatile tag memory 1060 and/or internal nonvolatile memory 1061, as appropriate.

Retention tests may be performed by controller 1050 when system 1000 is powered-up. The results of these power-up (i.e., start of day) retention tests may be used to create and/or update tags that are stored in external nonvolatile tag memory 1060 and/or internal nonvolatile memory 1061, as appropriate.

Tag control 1052 load tags entries from external nonvolatile tag memory 1060 and/or internal nonvolatile memory 1061, as appropriate, into tag query 1055. During operation of system 1000 with standard refresh intervals, test state machine 1015 and test state machine 1025 can monitor retention tests. Test state machine 1015 and test state machine 1025 can monitor retention tests during self-refresh operations by memory IC 1010 and memory IC 1020, respectively. Controller 1050 can monitor ECC errors in data received from memory IC 1010 and/or memory IC 1020 during normal system operation. The results of these retention tests and/or ECC checks can be used to update the tags stored in tag query 1055, external nonvolatile tag memory 1060, and/or internal nonvolatile memory 1061, as appropriate.

System 1000 can operate with controller 1050 extending the time between refresh operations of memory IC 1010 and/or memory IC 1020. During operation of system 1000 with extended refresh intervals, test state machine 1015 and test state machine 1025 can monitor retention tests. During operation of system 1000 with extended refresh intervals, test state machine 1015 and test state machine 1025 can monitor retention tests during self-refresh operations by memory IC 1010 and memory IC 1020, respectively. During operation of system 1000 with extended refresh intervals, controller 1050 can monitor ECC errors in data received from memory IC 1010 and/or memory IC 1020 during system operation. The results of these retention tests and/or ECC checks performed while system 1000 operates with extended refresh intervals can be used to update the tags stored in tag query 1055, external nonvolatile tag memory 1060, and/or internal nonvolatile memory 1061, as appropriate.

Figure 11:
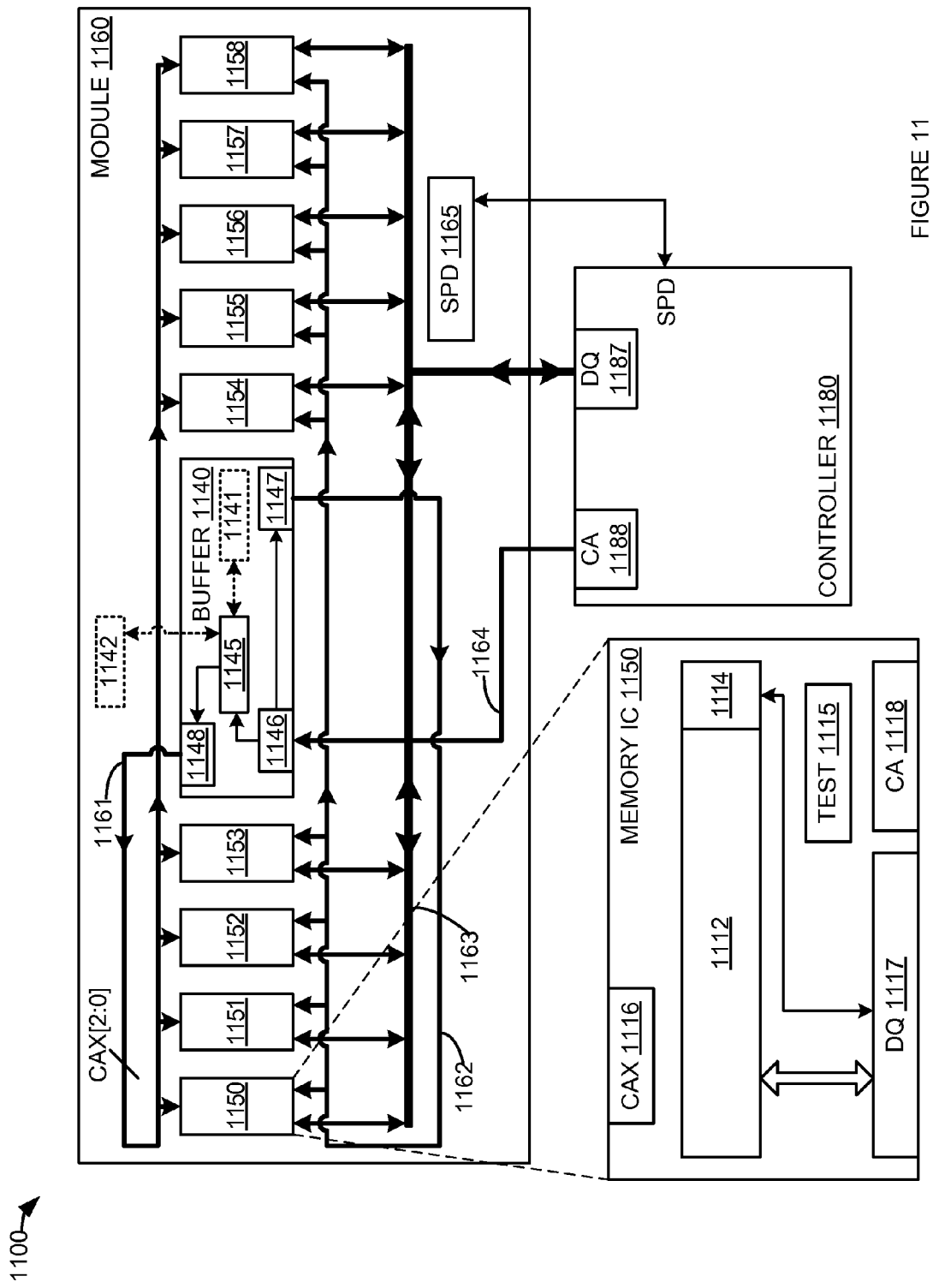
FIG. 11 is a block diagram illustrating a system with module buffer repair tags.

FIG. 11 is a block diagram illustrating a system with module buffer repair tags. In FIG. 11, system 1100 comprises controller 1180 and memory module 1160. Module 1160 includes buffer integrated circuit 1140, a rank of memory comprising memory devices 1150-1158, DQ connections 1163, command/address (CA) bus 1164, buffered CA bus 1162, secondary CA bus 1161, serial presence detect (SPD) 1165, and optionally external nonvolatile tag memory 1142. CA bus 1164 is operatively coupled between buffer 1140 and controller 1180. DQ connections 1163 are operatively coupled between controller 1180 and each of memory devices 1150-1158. Buffered CA bus 1162 is operatively coupled between buffer 1140 and each of memory devices 1150-1158. Secondary CA bus 1161 is operatively coupled between buffer 1140 and each of memory devices 1150-1158. SPD is operatively coupled to controller 1180.

In an embodiment, buffered CA bus 1162 is routed in a fly-by configuration. In other words, buffered CA bus 1162 is routed to memory device 1150 first, memory device 1151 second, and so on through memory device 1158. Secondary CA bus 1161 is also routed in a fly-by configuration. That is, Secondary CA bus 1161 is routed to memory device 1150 first, memory device 1151 second, and so on through memory device 1158. It should be understood that by routing both buffered CA bus 1162 and secondary CA bus 1161 in the same manner (i.e., in a fly-by configuration), secondary CA bus 1161 may use the same timing and clock signaling as buffered CA bus 1162. Thus, memory devices 1150-1158 can receive secondary CA bus 1161 signals without additional clock signal(s) dedicated to secondary CA bus 1161. However, secondary CA bus 1161 may have clock signal(s) dedicated to secondary CA bus 1161. In an embodiment, secondary CA bus 1161 transmits information in a serial manner.

In FIG. 11, memory device 1150 is shown in further detail. This further detail is an example of elements included in all of memory devices 1150-1158. Memory device 1150 includes main array 1112, repair array 1114, test state machine 1115, secondary CA interface (CAX interface) 1116, CA interface 1118, and DQ interface 1117. CAX interface 1116 is operatively coupled to secondary CA bus 1161. DQ interface 1117 is operatively coupled to DQ bus 1163. CA interface 1118 is operatively coupled to buffered CA bus 1162.

Memory devices 1150-1158 may function like memory IC 110 and memory devices 250-258, described herein. For example, the address from a memory controller may correspond to buffered CA bus 1162. The HIT and TAG[1:P] signals may correspond to signals received via secondary CA bus 1161. In an embodiment, secondary CA bus 1161 includes three serial signal lines CAX[2:0]. Using the timing described in FIG. 8 and FIG. 9, the three serial signal lines CAX[2:0] can each transmit eight (8) bits of information (T[7:0]) to each of memory devices 1150-1158. An example assignment of tag information to secondary CA bus 1161 signals is Oven in Table 1.

TABLE 1

|        | T[7] | T[6]  | T[5]  | T[4] | T[3]          | T[2] | T[1] | T[0] |
|--------|------|-------|-------|------|---------------|------|------|------|
| CAX[0] |      | reserved |    |      | UBIT[5:0]     |      |      |      |
| CAX[1] |      | reserved |    |      | VBIT[5:0]     |      |      |      |
| CAX[2] | DEV_ID_&_EN_U |  |  |    | DEV_ID_&_EN_U |      |      |      |

In Table 1, T[7:0] correspond to the bits being transmitted during each bit time on CAX[2:0]. (See, for example, FIG. 8 or FIG. 9.) DEV_ID_&_EN_U (device identification and enable, device U) is a four bit field that specifies which (if any) of memory devices 1150-1158 is to replace a column specified by the UBIT[5:0] field by data from the repair array in specified "U" memory device 1150-1158. Similarly, DEV_ID_&_EN_V (device identification and enable, device V) is a four bit field that specifies which (if any) of memory devices 1150-1158 is to replace a column specified by the VBIT[5:0] field by data from the repair array in specified "V" memory device 1150-1158. The bits in the "reserved" fields may be unused or, for example, used to modify the meaning of, or specify the validity (or enable) of, the associated UBIT[5:0], VBIT[5:0], DEV_ID_&_EN_U, and/or DEV_ID_&_EN_V fields.

Buffer 1140 includes tag query 1145, CA input interface 1146, CA output interface 1147, and secondary CA bus interface 1148. CA input interface 1146 is operatively coupled to CA bus 1164 to receive CA signals from controller 1180. CA output interface 1147 is operatively coupled to buffered CA bus 1162. CA input interface 1146 is operatively coupled to CA output interface 1147 so that CA output interface 1147 may output buffered CA signals to each of memory devices 1150-1158 via buffered CA bus 1162. CA input interface 1146 is operatively coupled to tag query 1145. Tag query 1145 is operatively coupled to external nonvolatile tag memory 1142 and/or internal nonvolatile tag memory 1141, as appropriate for the presence of external nonvolatile tag memory 1142 and/or internal nonvolatile tag memory 1141.

CA input interface 1146 is operatively coupled to tag query 1145. Tag query 1145 is operatively coupled to secondary CA bus 1161. In response to an address from CA interface 1146, tag query 1145 determines whether the address from the memory controller corresponds to an address stored in external nonvolatile tag memory 1142 or internal nonvolatile memory 1141, as appropriate. If there is a tag miss, tag query 1145 sends, via secondary CA bus 1161, an indicator that none of memory devices 1150-1158 should utilize (in the case of a read) or send (in the case of a write) data from/to their internal repair arrays (e.g., repair array 1114). In an embodiment, this indicator can be encoded into one or both of the DEV_ID_&_EN_U, and/or DEV_ID_&_EN_V fields. For example, DEV_ID_&_EN_U and/or DEV_ID_&_EN_V can be encoded with the decimal value 15 (0xFh) to indicate that there was a tag miss. DEV_ID_&_EN_U and/or DEV_ID_&_EN_V can be encoded with a decimal value other than 15 (0xFh) to indicate that there was at least one tag hit (for a two-way associated tag query).

If there is a tag hit, tag query 1145 sends an indicator that at least one of memory devices 1150-1158 should utilize or send data from/to their internal repair array. In an embodiment, this indicator can be encoded into one or both of the DEV_ID_&_EN_U, and/or DEV_ID_&_EN_V fields. Tag query 1145 also sends, via secondary CA bus 1161, one or more indicators which specify which of memory devices 1150-1158 should utilize or send data from/to their internal repair array. In an embodiment, these indicators can be encoded into one or both of the DEV_ID_&_EN_U, and/or DEV_ID_&_EN_V fields. For example, DEV_ID_&_EN_U can be encoded with the decimal value "0" (0x0h) to indicate memory device 1150 should utilize or send data from/to their internal repair array, DEV_ID_&_EN_V can be encoded with the decimal value "1" (0x1h) to indicate memory device 1151 should utilize or send data from/to their internal repair array, and so on.

Tag query 1145 also sends, via secondary CA bus 1161, one or more indicators (e.g., addresses) which provide the information needed by the specified memory devices 1150-1158 to replace one or more indicated memory cells with memory cells in their internal repair array. In an embodiment, these indicators (addresses) are given by UBIT[5:0] and VBIT[5:0] fields. In other words, the memory device 1150-1158 specified by the encoding of DEV_ID_&_EN_U (if any) should replace the one or more memory cells indicated by the UBIT[5:0] with memory cells in its internal repair array. Likewise, the memory device 1150-1158 specified by the encoding of DEV_ID_&_EN_V (if any) should replace the one or more memory cells indicated by the VBIT[5:0] with memory cells in its internal repair array.

In an embodiment, tests of the functioning and/or performance of memory devices 1150-1158 are performed. These tests may include retention tests. Retention tests of memory devices 1150-1158 may be performed or aided by test state machine 1115. Retention tests may be performed using an increased time between refreshes of memory devices 1150-1158. This increased time between refreshes may be varied in order to measure the retention time of the memory cells of memory devices 1150-1158.

Retention tests may be performed by test equipment (not shown in FIG. 11) before memory devices 1150-1158 or module 1160 is integrated into system 1100. These retention tests may be performed during the manufacturing of memory devices 1150-1158 (e.g., at wafer test, post-packaging, and/or after burn-in). The results of these retention tests may be used to create and/or update tags that are stored in external nonvolatile tag memory 1142 and/or internal nonvolatile tag memory 1141, as appropriate.

Retention tests may be performed by controller 1180 once memory devices 1150-1158 and/or module 1160 is integrated into system 1100. The results of these retention tests performed may be used to create and/or update tags that are stored in external nonvolatile tag memory 1142 and/or internal nonvolatile tag memory 1141, as appropriate.

Retention tests may be performed by controller 1180 when system 1100 is powered-up. The results of these power-up (i.e., start of day) retention tests may be used to create and/or update tags that are stored in external nonvolatile tag memory 1142 and/or internal nonvolatile tag memory 1141, as appropriate.

Buffer 1140 load tags entries from external nonvolatile tag memory 1142 and/or internal nonvolatile tag memory 1141, as appropriate, into tag query 1145. During operation of system 1100 with standard refresh intervals, the test state machines 1115 of memory devices 1150-1158 can monitor these retention tests. The test state machines 1115 of memory devices 1150-1158 can monitor retention tests during self-refresh operations. Controller 1180 can monitor ECC errors in data received from memory devices 1150-1158 during normal system operation. The results of these retention tests and/or ECC checks can be used to update the tags stored in external nonvolatile tag memory 1142, and/or internal nonvolatile tag memory 1141, as appropriate.

System 1100 can operate with controller 1180 extending the time between refresh operations of memory devices 1150-1158. During operation of system 1100 with extended refresh intervals, the test state machine 1115 of memory devices 1150-1158 can monitor these retention tests. During operation of system 1100 with extended refresh intervals, the test state machines 1115 of memory devices 1150-1158 can monitor retention tests during memory IC self-refresh operations. During operation of system 1100 with extended refresh intervals, controller 1180 can monitor ECC errors in data received from memory devices 1150-1158 during system operation. The results of these retention tests and/or ECC checks performed while system 1100 operates with extended refresh intervals can be used to update the tags stored in external nonvolatile tag memory 1142, and/or internal nonvolatile memory 1141, as appropriate.

Figure 12:
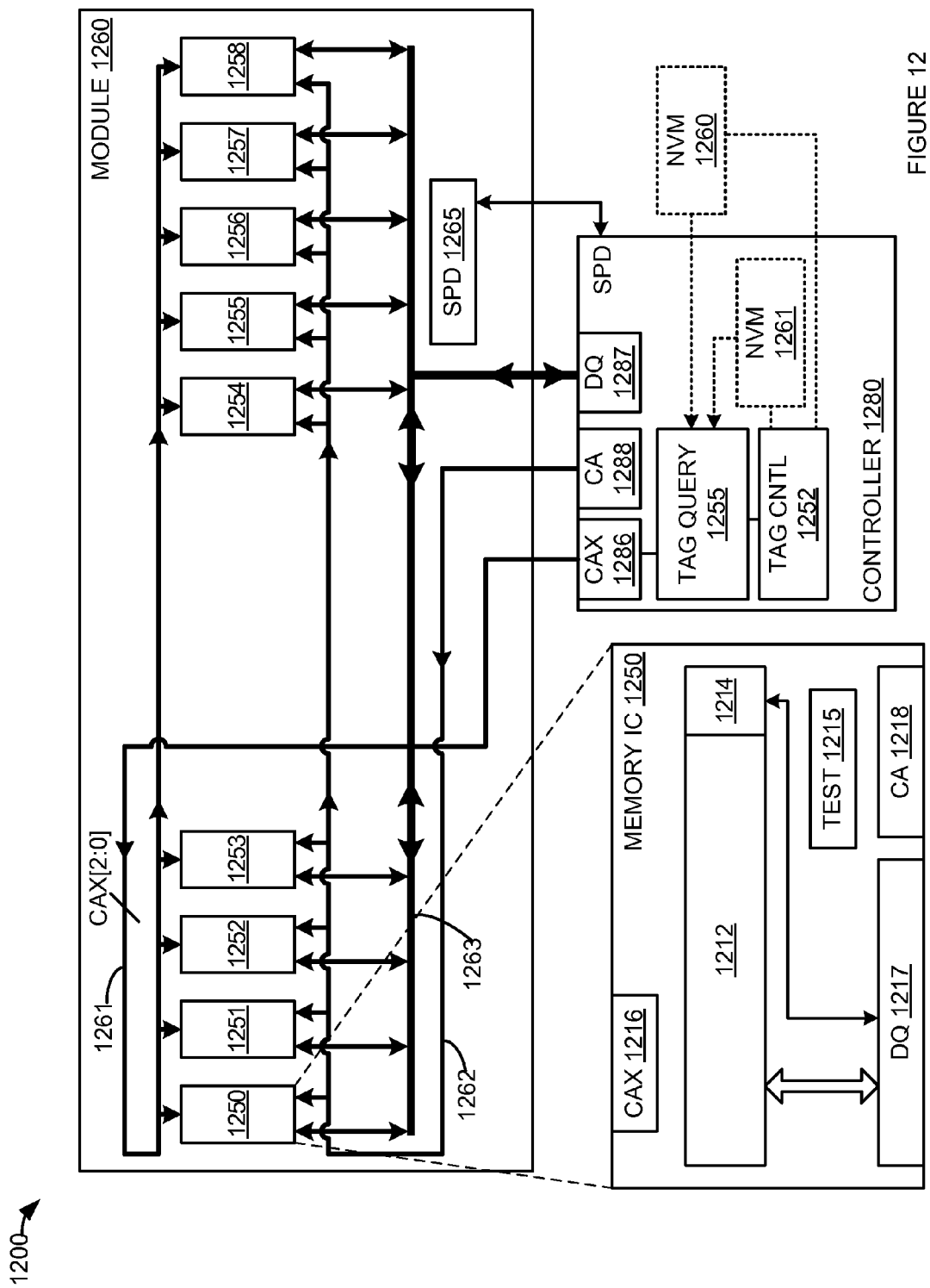
FIG. 12 is a block diagram illustrating a system with an unbuffered module.

FIG. 12 is a block diagram illustrating a system with an unbuffered module. In FIG. 12, system 1200 comprises controller 1280 and memory module 1260. Module 1260 includes a rank of memory comprising memory devices 1250-1258, DQ connections 1263, command/address (CA) bus 1262, secondary CA bus 1261, and serial presence detect (SPD) 1265. CA bus 1262 is operatively coupled between memory devices 1250-1258 and controller 1280. DQ connections 1263 are operatively coupled between controller 1280 and each of memory devices 1250-1258. Secondary CA bus 1261 is operatively coupled between controller 1280 and each of memory devices 1250-1258. SPD is operatively coupled to controller 1280.

In an embodiment, CA bus 1262 is routed in a fly-by configuration. In other words, CA bus 1262 is routed such that command/address signals propagate from controller 1280 to memory device 1250 first, memory device 1251 second, and so on until the signals reach memory device 1258. Secondary CA bus 1261 is also routed in a fly-by configuration. That is, secondary CA bus 1261 is routed such that command/address signals propagate from controller 1280 to memory device 1250 first, memory device 1251 second, and so on until those signals arrive at memory device 1258. It should be understood that by routing both CA bus 1262 and secondary CA bus 1261 in the same manner (i.e., in a fly-by configuration), secondary CA bus 1261 may use the same timing and clock signaling as CA bus 1262. Thus, memory devices 1250-1258 can receive secondary CA bus 1261 signals without additional clock signal(s) dedicated to secondary CA bus 1261. However, secondary CA bus 1261 may have clock signal(s) dedicated to secondary CA bus 1261. In an embodiment, secondary CA bus 1261 transmits information in a serial manner.

In FIG. 12, memory device 1250 is shown in further detail. This further detail is an example of elements included in all of memory devices 1250-1258. Memory device 1250 includes main array 1212, repair array 1214, test state machine 1215, secondary CA interface (CAX interface) 1216, CA interface 1218, and DQ interface 1217. CAX interface is operatively coupled to secondary CA bus 1261. DQ interface is operatively coupled to DQ bus 1263. CA interface is operatively coupled to CA bus 1262.

Memory devices 1250-1258 may function like memory IC 120 and memory devices 250-258, described herein. For example, the address from memory controller may correspond to CA bus 1262. The HIT and TAG[1:P] signals may correspond to signals received via secondary CA bus 1261. In an embodiment, secondary CA bus 1261 includes three serial signal lines CAX[2:0]. The three serial signal lines CAX[2:0] can each transmit eight (8) bits of information (T[7:0]) to each of memory devices 1250-1258. An example assignment of tag information to secondary CA bus 1261 signals is given in Table 2.

TABLE 2

|        | T[7] | T[6] | T[5] | T[4]  | T[3] | T[2] | T[1]  | T[0] |
|--------|------|------|------|-------|------|------|-------|------|
| CAX[0] | reserved ||||  UBIT[5:0] ||||
| CAX[1] | reserved ||||  VBIT[5:0] ||||
| CAX[2] | DEV_ID_&_EN_U |||| DEV_ID_&_EN_U ||||

In Table 2, T[7:0] correspond to the bits being transmitted during each bit time on CAX[2:0]. DEV_ID_&_EN_U represents a four bit field that specifies which (if any) of memory devices 1250-1258 is to replace a column specified by the UBIT[5:0] field by data from the repair array in specified "U" memory device 1250-1258. Similarly, DEV_ID_&_EN_V represents a four bit field that specifies which (if any) of memory devices 1250-1258 is to replace a column specified by the VBIT[5:0] field by data from the repair array in specified "V" memory device 1250-1258. The bits in the "reserved" fields may be unused or, for example, used to modify the meaning of, or specify the validity (or enable) of, the associated UBIT[5:0], VBIT[5:0], DEV_ID_&_EN_U, and/or DEV_ID_&_EN_V fields.

Controller 1280 includes tag query 1255, CA interface 1288, secondary CA bus interface 1286, DQ interface 1287, SPD interface, tag query 1255, tag control 1252, and optionally internal nonvolatile tag memory 1261. System 1200 may optionally include external nonvolatile tag memory 1260. CA interface 1288 is operatively coupled to CA bus 1262. Tag query 1255 is operatively coupled to external nonvolatile tag memory 1260 and/or internal nonvolatile tag memory 1261, as appropriate for the presence of external nonvolatile tag memory 1260 and/or internal nonvolatile tag memory 1261. Tag control 1252 is operatively coupled to tag query 1255. Tag control 1252 is also operatively coupled to external nonvolatile tag memory 1260 and/or internal nonvolatile tag memory 1261, as appropriate, for the presence of external nonvolatile tag memory 1260 and/or internal nonvolatile tag memory 1261.

Tag query 1255 is operatively coupled to secondary CA bus interface 1286. In response to an address, tag query 1255 determines whether the address corresponds to an address stored in external nonvolatile tag memory 1260 or internal nonvolatile memory 1261, as appropriate. If there is a tag miss, tag query 1255 sends, via secondary CA bus 1261, an indicator that none of memory devices 1250-1258 should utilize (in the case of a read) or send (in the case of a write) data from/to their internal repair arrays (e.g., repair array 1214). In an embodiment, this indicator can be encoded into one or both of the DEV_ID_&_EN_U, and/or DEV_ID_&_EN_V fields. For example, DEV_ID_&_EN_U and/or DEV_ID_&_EN_V can be encoded with the decimal value 15 (0xFh) to indicate that there was a tag miss. DEV_ID_&_EN_U and/or DEV_ID_&_EN_V can be encoded with a decimal value other than 15 (0xFh) to indicate that there was at least one tag hit (for a two-way associated tag query).

If there is a tag hit, tag query 1255 sends an indicator that at least one of memory devices 1250-1258 should utilize or send data from/to their internal repair array. In an embodiment, this indicator can be encoded into one or both of the DEV_ID_&_EN_U, and/or DEV_ID_&_EN_V fields. Tag query 1255 also sends, via secondary CA bus 1261, one or more indicators which specify which of memory devices 1250-1258 should utilize or send data from/to their internal repair array. In an embodiment, these indicators can be encoded into one or both of the DEV_ID_&_EN_U, and/or DEV_ID_&_EN_V fields. For example, DEV_ID_&_EN_U can be encoded with the decimal value "0" (0x0h) to indicate memory device 1250 should utilize or send data from/to its internal repair array, DEV_ID_&_EN_V can be encoded with the decimal value "1" (0x1h) to indicate memory device 1251 should utilize or send data from/to its internal repair array, and so on.

Tag query 1255 also sends, via secondary CA bus 1261, one or more indicators (e.g., addresses) which provide the information needed by the specified memory devices 1250-1258 to replace one or more indicated memory cells with memory cells in their internal repair array. In an embodiment, these indicators (addresses) are given by UBIT[5:0] and VBIT[5:0] fields. In other words, the memory device 1250-1258 specified by the encoding of DEV_ID_&_EN_U (if any) should replace the one or more memory cells indicated by the UBIT[5:0] with memory cells in its internal repair array. Likewise, the memory device 1250-1258 specified by the encoding of DEV_ID_&_EN_V (if any) should replace the one or more memory cells indicated by the VBIT[5:0] with memory cells in its internal repair array.

In an embodiment, tests of the functioning and/or performance of memory devices 1250-1258 are performed. These tests may include retention tests. Retention tests of memory devices 1250-1258 may be performed or aided by test state machine 1215. Retention tests may be performed using an increased time between refreshes of memory devices 1250-1258. This increased time between refreshes may be varied in order to measure the retention time of the memory cells of memory devices 1250-1258.

Retention tests may be performed by test equipment (not shown in FIG. 12) before memory devices 1250-1258 or module 1260 is integrated into system 1200. These retention tests may be performed during the manufacturing of memory devices 1250-1258 (e.g., at wafer test, post-packaging, and/or after burn-in). The results of these retention tests may be used to create and/or update tags that are stored in external nonvolatile tag memory 1260 and/or internal nonvolatile tag memory 1261, as appropriate.

Retention tests may be performed by controller 1280 once memory devices 1250-1258 and/or module 1260 are integrated into system 1200. The results of these retention tests performed may be used to create and/or update tags that are stored in external nonvolatile tag memory 1260 and/or internal nonvolatile tag memory 1261, as appropriate.

Retention tests may be performed by controller 1280 when system 1200 is powered-up. The results of these power-up (i.e., start of day) retention tests may be used to create and/or update tags that are stored in external nonvolatile tag memory 1260 and/or internal nonvolatile tag memory 1261, as appropriate.

Tag control 1252 loads tags entries from external nonvolatile tag memory 1260 and/or internal nonvolatile tag memory 1261, as appropriate, into tag query 1255. During operation of system 1200 with standard refresh intervals, the test state machines 1215 of memory devices 1250-1258 can monitor these retention tests. The test state machines 1215 of memory devices 1250-1258 can monitor retention tests during self-refresh operations. Controller 1280 can monitor ECC errors in data received from memory devices 1250-1258 during normal system operation. The results of these retention tests can be used to update the tags stored in external nonvolatile tag memory 1260, and/or internal nonvolatile tag memory 1261, as appropriate.

System 1200 can operate with controller 1280 extending the time between refresh operations of memory devices 1250-1258. During operation of system 1200 with extended refresh intervals, the test state machine 1215 of memory devices 1250-1258 can monitor these retention tests. During operation of system 1200 with extended refresh intervals, the test state machines 1215 of memory devices 1250-1258 can monitor retention tests during memory IC self-refresh operations. During operation of system 1200 with extended refresh intervals, controller 1280 can monitor ECC errors in data received from memory devices 1250-1258 during system operation. The results of these retention tests performed while system 1200 operates with extended refresh intervals can be used to update the tags stored in external nonvolatile tag memory 1260, and/or internal nonvolatile memory 1261, as appropriate.

Figure 13:
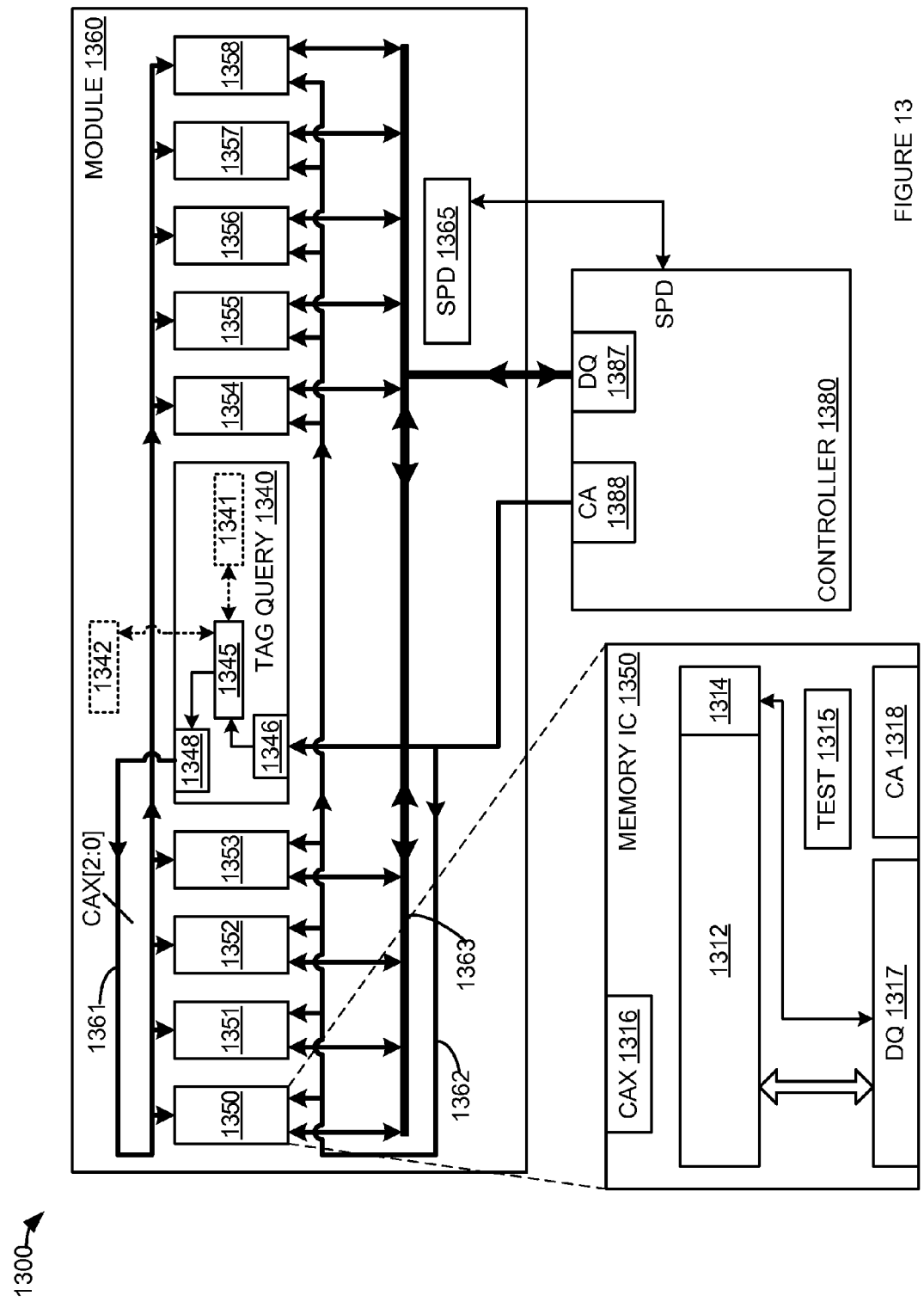
FIG. 13 is a block diagram illustrating a system having a module with an unregistered C/A bus.

FIG. 13 is a block diagram illustrating a system having a module with an unregistered C/A bus. In FIG. 13, system 1300 comprises controller 1380 and memory module 1360. Module 1360 includes tag query integrated circuit 1340, a rank of memory comprising memory devices 1350-1358, DQ connections 1363, command/address (CA) bus 1362, secondary CA bus 1361, serial presence detect (SPD) 1365, and optionally external nonvolatile tag memory 1342. CA bus 1362 is operatively coupled between controller 1380, tag query IC 1340, and each of memory devices 1350-1358. DQ connections 1363 are operatively coupled between controller 1380 and each of memory devices 1350-1358. Secondary CA bus 1361 is operatively coupled between tag query IC 1340 and each of memory devices 1350-1358. SPD is operatively coupled to controller 1380.

In an embodiment, CA bus 1362 is routed in a fly-by configuration. In other words, CA bus 1362 is routed such that signals propagating on CA bus 1362 propagate to tag query IC 1340 first, memory device 1350 second, memory device 1351 third, and so on through memory device 1358. Secondary CA bus 1361 is also routed in a fly-by configuration. That is, Secondary CA bus 1361 is routed such that signals propagating on CA bus 1361 propagate from tag query 1340 to memory device 1350 first, memory device 1351 second, and so on through memory device 1358. Memory devices 1350-1358 may receive secondary CA bus 1361 signals without additional clock signal(s) dedicated to secondary CA bus 1361. However, secondary CA bus 1361 may have clock signal(s) dedicated to secondary CA bus 1361. In an embodiment, secondary CA bus 1361 transmits information in a serial manner.

In FIG. 13, memory device 1350 is shown in further detail. This further detail is an example of elements included in all of memory devices 1350-1358. Memory device 1350 includes main array 1312, repair array 1314, test state machine 1315, secondary CA interface (CAX interface) 1316, CA interface 1318, and DQ interface 1317. CAX interface is operatively coupled to secondary CA bus 1361. DQ interface is operatively coupled to DQ bus 1363. CA interface is operatively coupled to CA bus 1362.

Memory devices 1350-1358 may function like memory IC 130 and memory devices 250-258, described herein. For example, the address from memory controller may correspond to CA bus 1362. The HIT and TAG[1:P] signals may correspond to signals received via secondary CA bus 1361. In an embodiment, secondary CA bus 1361 includes three serial signal lines CAX[2:0]. The three serial signal lines CAX[2:0] may each transmit eight (8) bits of information (T[7:0]) to each of memory devices 1350-1358. An example assignment of tag information to secondary CA bus 1361 signals is given in Table 3.

TABLE 3

| | T[7] | T[6] | T[5] | T[4] | T[3] | T[2] | T[1] | T[0] |
|---|---|---|---|---|---|---|---|---|
| CAX[0] | reserved | | | | UBIT[5:0] | | | |
| CAX[1] | reserved | | | | VBIT[5:0] | | | |
| CAX[2] | DEV_ID_&_EN_U | | | | DEV_ID_&_EN_U | | | |

In Table 3, T[7:0] correspond to the bits being transmitted during each bit time on CAX[2:0]. DEV_ID_&_EN_U represents a four bit field that specifies which (if any) of memory devices 1350-1358 is to replace a column specified by the UBIT[5:0] field by data from the repair array in specified "U" memory device 1350-1358. Similarly, DEV_ID_&_EN_V (device identification and enable, device V) is a four bit field that specifies which (if any) of memory devices 1350-1358 is to replace a column specified by the VBIT[5:0] field by data from the repair array in specified "V" memory device 1350-1358. The bits in the "reserved" fields may be unused or, for example, used to modify the meaning of, or specify the validity (or enable) of, the associated UBIT[5:0], VBIT[5:0], DEV_ID_&_EN_U, and/or DEV_ID_&_EN_V fields.

Tag query IC 1340 includes tag query 1345, CA input interface 1346, and secondary CA bus interface 1348. CA input interface 1346 is operatively coupled to CA bus 1362 to receive CA signals from controller 1380. CA input interface 1346 is operatively coupled to tag query 1345. Tag query 1345 is operatively coupled to external nonvolatile tag memory 1342 and/or internal nonvolatile tag memory 1341, as appropriate for the presence of external nonvolatile tag memory 1342 and/or internal nonvolatile tag memory 1341.

CA input interface 1346 is operatively coupled to tag query 1345. Tag query 1345 is operatively coupled to secondary CA bus 1361. In response to an address from CA interface 1346, tag query 1345 determines whether the address from the memory controller corresponds to an address stored in external nonvolatile tag memory 1342 or internal nonvolatile memory 1341, as appropriate. If there is a tag miss, tag query 1345 sends, via secondary CA bus 1361, an indicator that none of memory devices 1350-1358 should utilize (in the case of a read) or send (in the case of a write) data from/to their internal repair arrays (e.g., repair array 1314). In an embodiment, this indicator can be encoded into one or both of the DEV_ID_&_EN_U, and/or DEV_ID_&_EN_V fields. For example, DEV_ID_&_EN_U and/or DEV_ID_&_EN_V can be encoded with the decimal value 15 (0xFh) to indicate that there was a tag miss. DEV_ID_&_EN_U and/or DEV_ID_&_EN_V can be encoded with a decimal value other than 15 (0xFh) to indicate that there was at least one tag hit (for a two-way associated tag query).

If there is a tag hit, tag query 1345 sends an indicator that at least one of memory devices 1350-1358 should utilize or send data from/to their internal repair array. In an embodiment, this indicator can be encoded into one or both of the DEV_ID_&_EN_U, and/or DEV_ID_&_EN_V fields. Tag query 1345 also sends, via secondary CA bus 1361, one or more indicators which specify which of memory devices 1350-1358 should utilize or send data from/to their internal repair array. In an embodiment, these indicators can be encoded into one or both of the DEV_ID_&_EN_U, and/or DEV_ID_&_EN_V fields. For example, DEV_ID_&_EN_U can be encoded with the decimal value "0" (0x0h) to indicate memory device 1350 should utilize or send data from/to its internal repair array, DEV_ID_&_EN_V can be encoded with the decimal value "1" (0x1h) to indicate memory device 1351 should utilize or send data from/to its internal repair array, and so on.

Tag query 1345 also sends, via secondary CA bus 1361, one or more indicators (e.g., addresses) which provide the information needed by the specified memory devices 1350-1358 to replace one or more indicated memory cells with memory cells in their internal repair array. In an embodiment, these indicators (addresses) are given by UBIT[5:0] and VBIT[5:0] fields. In other words, the memory device 1350-1358 specified by the encoding of DEV_ID_&_EN_U (if any) should replace the one or more memory cells indicated by the UBIT[5:0] with memory cells in its internal repair array. Likewise, the memory device 1350-1358 specified by the encoding of DEV_ID_&_EN_V (if any) should replace the one or more memory cells indicated by the VBIT[5:0] with memory cells in its internal repair array.

In an embodiment, tests of the functioning and/or performance of memory devices 1350-1358 are performed. These tests may include retention tests. Retention tests of memory devices 1350-1358 may be performed or aided by test state machine 1315. Retention tests may be performed using an increased time between refreshes of memory devices 1350-1358. This increased time between refreshes may be varied in order to measure the retention time of the memory cells of memory devices 1350-1358.

Retention tests may be performed by test equipment (not shown in FIG. 13) before memory devices 1350-1358 or module 1360 is integrated into system 1300. These retention tests may be performed during the manufacturing of memory devices 1350-1358 (e.g., at wafer test, post-packaging, and/or after burn-in). The results of these retention tests may be used to create and/or update tags that are stored in external nonvolatile tag memory 1342 and/or internal nonvolatile tag memory 1341, as appropriate.

Retention tests may be performed by controller 1380 once memory devices 1350-1358 and/or module 1360 is integrated into system 1300. The results of these retention tests performed may be used to create and/or update tags that are stored in external nonvolatile tag memory 1342 and/or internal nonvolatile tag memory 1341, as appropriate.

Retention tests may be performed by controller 1380 when system 1300 is powered-up. The results of these power-up (i.e., start of day) retention tests may be used to create and/or update tags that are stored in external nonvolatile tag memory 1342 and/or internal nonvolatile tag memory 1341, as appropriate.

Tag query IC 1340 load tags entries from external nonvolatile tag memory 1342 and/or internal nonvolatile tag memory 1341, as appropriate, into tag query 1345. During operation of system 1300 with standard refresh intervals, the test state machines 1315 of memory devices 1350-1358 can monitor these retention tests. The test state machines 1315 of memory devices 1350-1358 can monitor retention tests during self-refresh operations. Controller 1380 can monitor ECC errors in data received from memory devices 1350-1358 during normal system operation. The results of these retention tests can be used to update the tags stored in external nonvolatile tag memory 1342, and/or internal nonvolatile tag memory 1341, as appropriate.

System 1300 can operate with controller 1380 extending the time between refresh operations of memory devices 1350-1358. During operation of system 1300 with extended refresh intervals, the test state machine 1315 of memory devices 1350-1358 can monitor these retention tests. During operation of system 1300 with extended refresh intervals, the test state machines 1315 of memory devices 1350-1358 can monitor retention tests during memory IC self-refresh operations. During operation of system 1300 with extended refresh intervals, controller 1380 can monitor ECC errors in data received from memory devices 1350-1358 during system operation. The results of these retention tests performed while system 1300 operates with extended refresh intervals can be used to update the tags stored in external nonvolatile tag memory 1342, and/or internal nonvolatile memory 1341, as appropriate.

Figure 14:
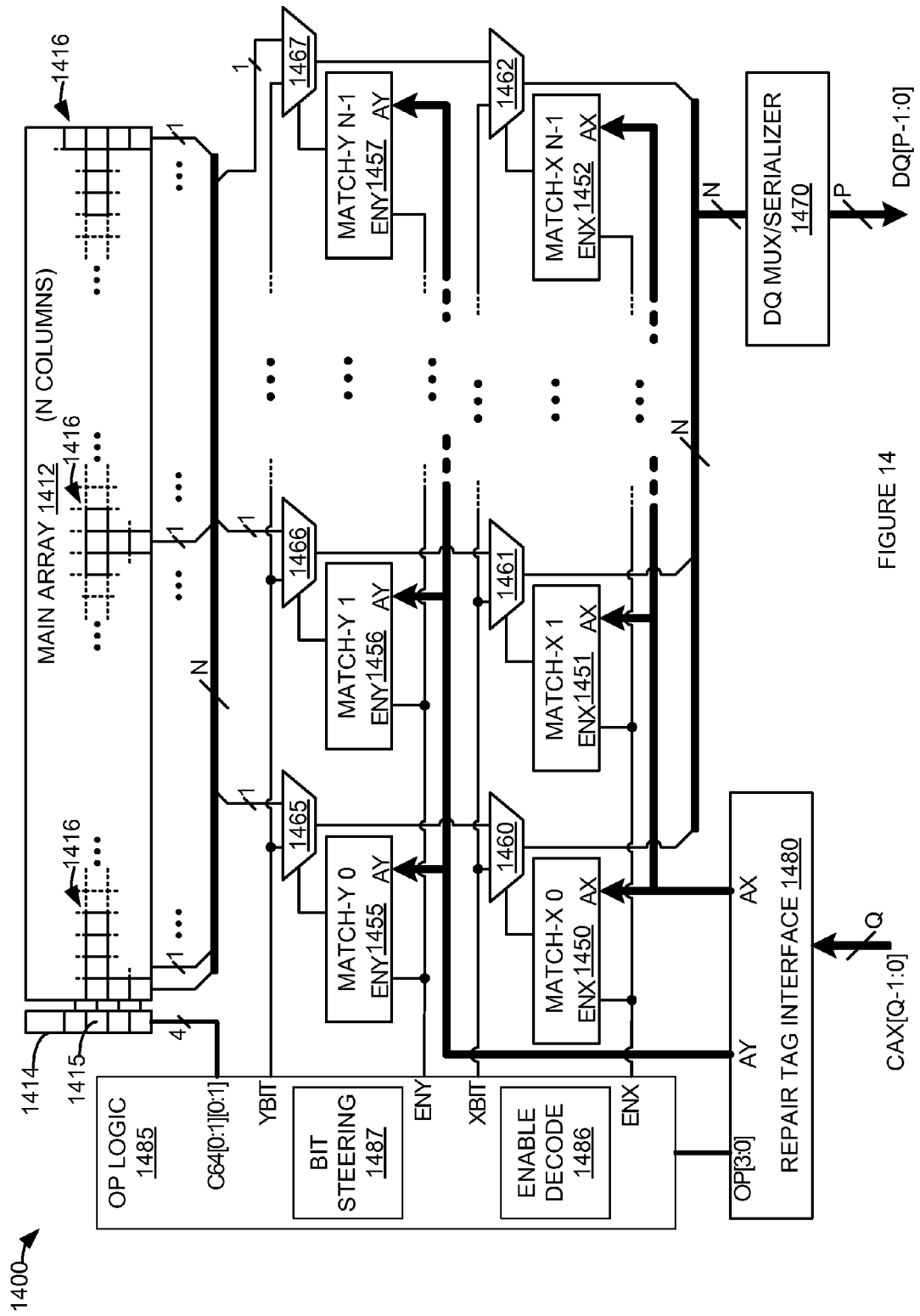
FIG. 14 is a block diagram illustrating a read configuration for multi-bit repair.

FIG. 14 is a block diagram illustrating a read configuration for multi-bit repair. Memory 1400 comprises main array 1412, repair array 1414, first repair decoders 1450-1452, first repair 2:1 multiplexors 1460-1462, second repair decoders 1455-1457, second repair 2:1 multiplexors 1465-1467, DQ multiplexor/serializer 1470, repair tag interface 1480, and op-code logic 1485. Op-code logic 1485 includes bit steering logic 1487 and enable decode logic 1486. Main array 1412 comprises a plurality of memory tiles 1416 arranged in a 2-dimensional array having N number of columns. In an embodiment, repair array 1414 comprises a plurality of memory tiles 1415 arranged into one column and the same number of rows as main array 1412.

Repair tag interface 1480 receives zero, one, or two addresses, and zero, one, or two hit indicators from external tag query circuitry (not shown in FIG. 14). In FIG. 14, the two addresses are output as AX and AY from repair tag interface 1480. The hit indicators are encoded as part of an op-code (OP[3:0]) output from repair tag interface 1480. Repair tag interface receives Q number of signals CAX[Q−1:0]. In an embodiment, Q is equal to 2. DQ mux/serializer 1470 outputs P number of data signals DQ[P−1:0].

The op-code OP[3:0] from repair tag interface 1480 is operatively coupled to op-code logic 1485. Op-code logic 1485 is operatively coupled to repair array 1414 to receive four bits C64[0:1][0:1] of repair data. Op-code logic 1485 includes enable decode 1486 and bit steering 1487. Enable decode 1486 decodes OP[3:0] to produce two enable outputs ENX and ENY. Bit steering 1487 also uses information from OP[3:0] to route one of repair data C64[0:1][0:1] to a first repair bit output (YBIT) from op-code logic 1485, and to route one of repair data C64[0:1][0:1] to a second repair bit output (XBIT) from op-code logic 1485.

In FIG. 14, multiplexors 1465-1467 represent N number of multiplexors. Multiplexors 1465-1467 are configured to receive, at a first input, the first repair bit, YBIT, output from op-code logic 1485. Each of multiplexors 1465-1467 is also configured to each receive a different one of N bits from main array 1412. In other words, each of multiplexors 1465-1467 is configured to receive one bit from a unique one of the N columns of main array 1412. The selection by multiplexor 1460-1462 of either the YBIT routed by op-code logic 1485 from repair array 1414 versus the bit from main array 1412 is controlled by a corresponding respective one of decoders 1455-1457. Each of decoders 1455-1457 (a.k.a., Match-Y 0, Match-Y 1, . . . Match-Y N−1) is configured to receive the AY address from repair tag interface 1480, and an enable signal, ENY, from op-code logic 1485. If the enable signal ENY is asserted, and the AY address received from repair tag interface 1480 matches the respective decoder 1455-1457's address (i.e., the address 0 matches decoder 1455, the address 1 matches decoder 1456, and so on), the respective decoder 1455-1457 controls the corresponding multiplexor 1465-1467 to output the YBIT received from op-code logic 1485. If the enable signal is not asserted, or the AY address received from repair tag interface 1480 does not match the respective decoder 1455-1457's address, the respective decoder 1450-1452 controls the corresponding multiplexor 1465-1467 to output the bit it received from main array 1412. The N number of bits output by the N number of multiplexors 1465-1467 are provided to the second input of multiplexors 1460-1462.

In FIG. 14, multiplexors 1460-1462 represent N number of multiplexors. Multiplexors 1460-1462 are configured to receive, at a first input, the second repair bit, XBIT, output from op-code logic 1485. Each of multiplexors 1460-1462 is also configured to each receive a different one of N bits from multiplexors 1465-1467. In other words, each of multiplexors 1460-1462 is configured to receive one bit from a unique one of the N multiplexors 1465-1467. The selection by multiplexor 1460-1462 of either the 1 bit from op-code logic 1484 or the bit from multiplexor 1465-1467 is controlled by a corresponding respective one of decoders 1450-1452. Each of decoders 1450-1452 (a.k.a., Match-X 0, Match-X 1, . . . Match-X N−1) is configured to receive the AX address from repair tag interface 1480, and an enable signal, ENX, from op-code logic 1485. If the enable signal ENX is asserted, and the AX address received from repair tag interface 1480 matches the respective decoder 1450-1452's address (i.e., the address 0 matches decoder 1450, the address 1 matches decoder 1451, and so on), the respective decoder 1450-1452 controls the corresponding multiplexor 1460-1462 to output the XBIT received from op-code logic 1485. If the enable signal is not asserted, or the AX address received from repair tag interface 1480 does not match the respective decoder 1450-1452's address, the respective decoder 1450-1452 controls the corresponding multiplexor 1460-1462 to output the bit it received from the corresponding multiplexor 1465-1467. The N number of bits output by the N number of multiplexors 1460-1462 are provided to DQ Mux/serializer 1470. DQ mux/serializer 1470 outputs P number of bits at a time.

An example assignment of op-codes to outputs of op-code logic 1485 is given in Table 4.

TABLE 4

| OP[3:0] | | | | XBIT Action | YBIT Action |
|---|---|---|---|---|---|
| 0 | 0 | 0 | 0 | XBIT = C64[0][0]; ENX = asserted | ENY = deasserted |
| 0 | 0 | 0 | 1 | XBIT = C64[0][0]; ENX = asserted | YBIT = C64[0][1]; ENY = asserted |
| 0 | 0 | 1 | 0 | XBIT = C64[0][0]; ENX = asserted | YBIT = C64[1][0]; ENY = asserted |
| 0 | 0 | 1 | 1 | XBIT = C64[0][0]; ENX = asserted | YBIT = C64[1][1]; ENY = asserted |
| 0 | 1 | 0 | 0 | ENX = deasserted | ENY = deasserted |
| 0 | 1 | 0 | 1 | XBIT = C64[0][1]; ENX = asserted | ENY = deasserted |
| 0 | 1 | 1 | 0 | XBIT = C64[0][1]; ENX = asserted | YBIT = C64[1][0]; ENY = asserted |
| 0 | 1 | 1 | 1 | XBIT = C64[0][1]; ENX = asserted | YBIT = C64[1][1]; ENY = asserted |
| 1 | 0 | 0 | 0 | ENX = deasserted | ENY = deasserted |
| 1 | 0 | 0 | 1 | ENX = deasserted | ENY = deasserted |
| 1 | 0 | 1 | 0 | XBIT = C64[1][0]; ENX = asserted | ENY = deasserted |
| 1 | 0 | 1 | 1 | XBIT = C64[1][0]; ENX = asserted | YBIT = C64[1][1]; ENY = asserted |
| 1 | 1 | 0 | 0 | ENX = deasserted | ENY = deasserted |

TABLE 4-continued

| OP[3:0] | | | | XBIT Action | YBIT Action |
|---|---|---|---|---|---|
| 1 | 1 | 0 | 1 | ENX = deasserted | ENY = deasserted |
| 1 | 1 | 1 | 0 | ENX = deasserted | ENY = deasserted |
| 1 | 1 | 1 | 1 | XBIT = C64[1][1]; ENX = asserted | ENY = deasserted |

Figure 15:
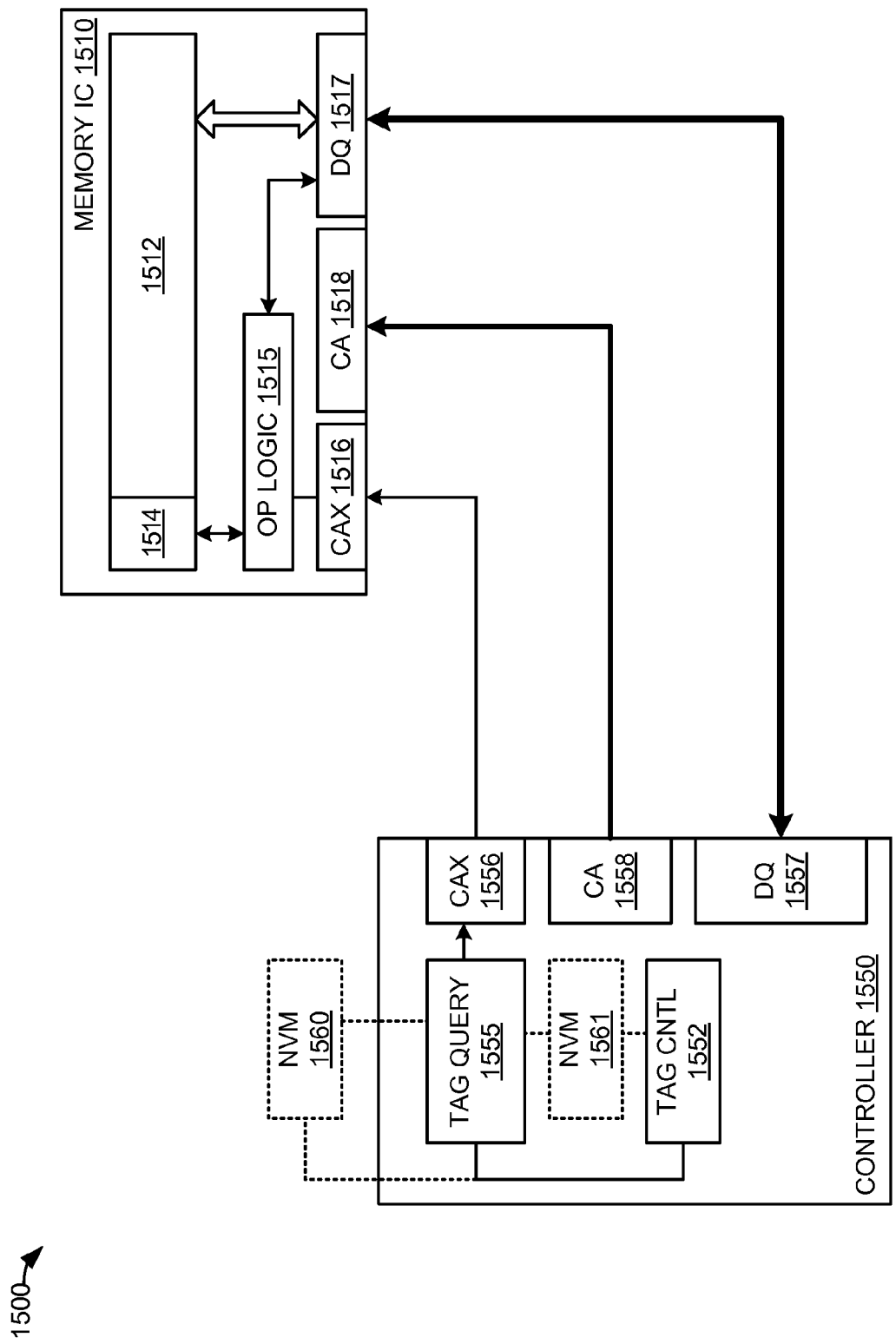
FIG. 15 is a block diagram illustrating a system with multi-bit repair.

FIG. 15 is a block diagram illustrating a system with multi-bit repair. System 1500 comprises memory IC 1510, controller 1550, and optionally external nonvolatile tag memory 1560. Controller 1550 includes tag query 1555, tag control 1552, secondary CA interface (CAX interface) 1556, CA interface 1558, DQ interface 1557, and optionally internal nonvolatile tag memory 1561. Memory IC 1510 includes main array 1512, repair array 1514, op-code logic 1515, secondary CA interface (CAX interface) 1516, CA interface 1518, and DQ interface 1517.

CAX interface 1556 of controller 1550 is operatively coupled to CAX interface 1516 of memory IC 1510. CA interface 1558 of controller 1550 is operatively coupled to CA interface 1518 of memory IC 1510. DQ interface 1557 of controller 1550 is operatively coupled to DQ interface 1517 of memory IC 1510. Tag control 1552 and tag query 1555 are operatively coupled to external nonvolatile memory 1560 and/or internal nonvolatile memory 1561, as appropriate for the presence of external nonvolatile memory 1560 and/or internal nonvolatile memory 1561.

Tag control 1552 load tags entries from external nonvolatile tag memory 1560 and/or internal nonvolatile memory 1561, as appropriate, into tag query 1555. During operation, tag query 1555 may provide memory IC 1510 with zero, one, or two addresses, and zero, one, or two hit indicators. These zero, one, or two hit indicators may be encoded as part of an op-code, described herein. For example, the zero, one, or two hit indicators may be encoded as described in Table 4 and may cause memory IC 1510 to operate in the manner described with reference to FIG. 14. In response to zero, one, or two addresses, and zero, one, or two hit indicators memory IC 1510 may replace zero, one, or two memory cells in main array 1512 with data from repair array 1514. The data from main array 1512, with the zero, one, or two bits replaced by data from repair array 1514, is coupled to DQ interface 1517 to be output by memory IC 1510.

Figure 16:
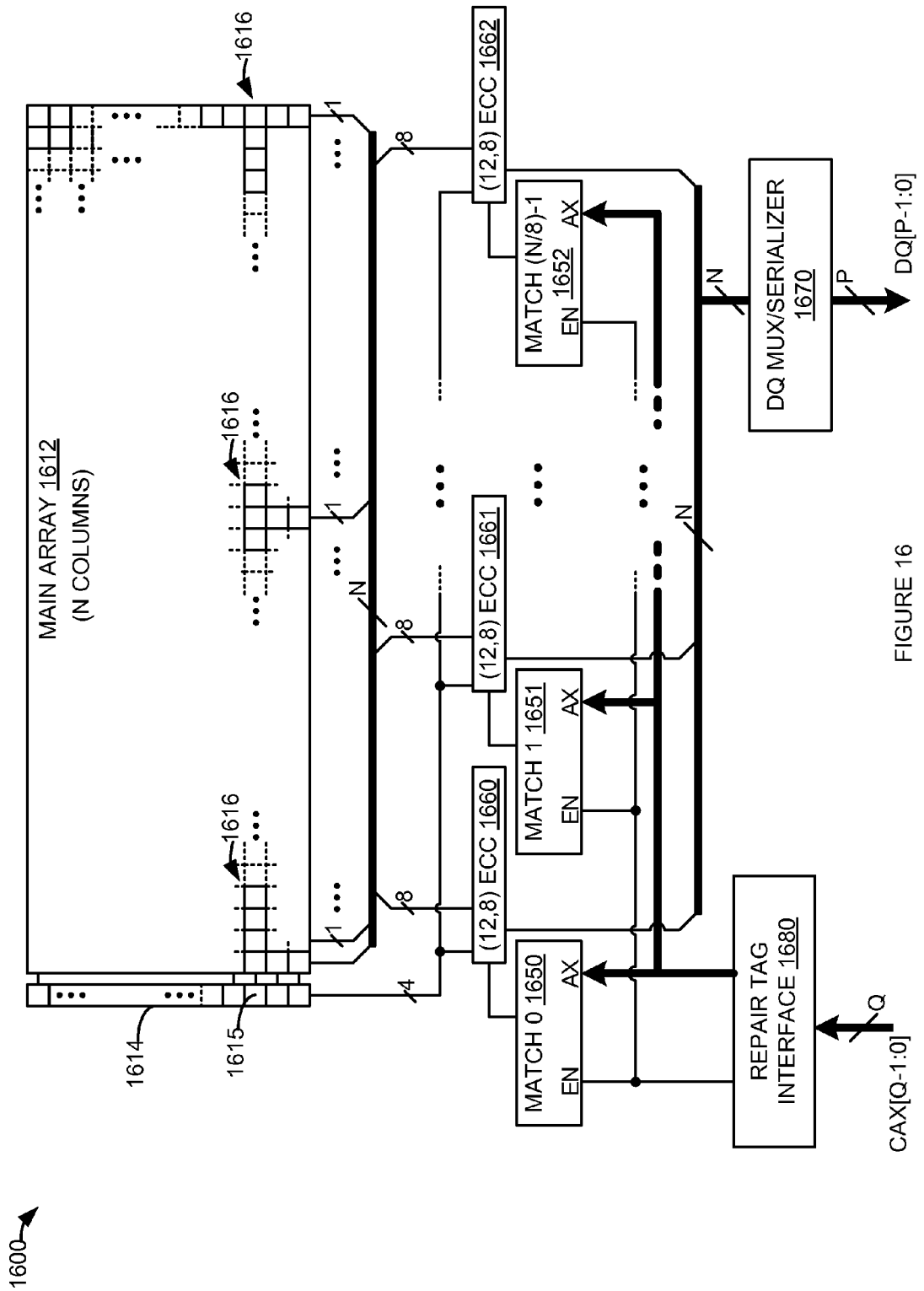
FIG. 16 is a block diagram illustrating an external tag ECC repair read configuration.

FIG. 16 is a block diagram illustrating an external tag ECC repair read configuration. Memory 1600 comprises main array 1612, repair array 1614, decoders 1650-1652, (12,8) error correcting code (ECC) correctors 1660-1662, DQ multiplexor/serializer 1670, and repair tag interface 1680. Main array 1612 comprises a plurality of memory tiles 1616 arranged in a 2-dimensional array having N number of columns. In an embodiment, repair array 1614 comprises a plurality of memory tiles 1615 arranged into one column and the same number of rows as main array 1612. Repair tag interface 1680 receives an address and "hit" indicator from external tag query circuitry (not shown in FIG. 16). In FIG. 16, the address and "hit" indicator may comprise Q number of signals CAX[Q−1:0]. DQ Mux/serializer 1670 outputs P number of data signals DQ[P−1:0].

In FIG. 16, ECC correctors 1660-1662 represent N/8 (N divided by 8) number of ECC correctors. Each of ECC correctors 1660-1662 is configured to receive, at a first input, the same 4 bits from repair array 1614. Each of ECC correctors 1660-1662 is also configured to each receive a different eight (8) of N bits from main array 1612. In other words, each of ECC correctors 1660-1662 is configured to receive 8 bits from a unique set of the N columns of main array 1612. Whether an ECC corrector 1660-1662 uses the 4 bits from repair array 1614 to correct the 8 bits from main array 1612 is controlled by a corresponding respective one of decoders 1650-1652. Each of decoders 1650-1652 (a.k.a., Match 0, Match 1, . . . Match (N/8)−1) is configured to receive an address from repair tag interface 1680, and an enable signal. If the enable signal is asserted, and the address received from repair tag interface 1680 matches the respective decoder 1650-1652's address (i.e., the address 0 matches decoder 1650, the address 1 matches decoder 1651, and so on), the respective decoder 1650-1652 controls the corresponding ECC corrector 1660-1662 to output data that has been corrected using a 12,8 error correcting code. The eight bits received from main array 1612 are used as the data bits. The four bits received from the repair array are used as syndrome bits. If the enable signal is not asserted, or the address received from repair tag interface 1680 does not match the respective decoder 1650-1652's address, the respective decoder 1650-1652 controls the corresponding ECC corrector 1660-1662 to output the 8 bits it received from main array 1612 unmodified. The N number of bits output by the N/8 number of ECC correctors 1660-1662 are provided to DQ mux/serializer 1670. DQ mux/serializer 1670 outputs P number of bits at a time.

Figure 17:
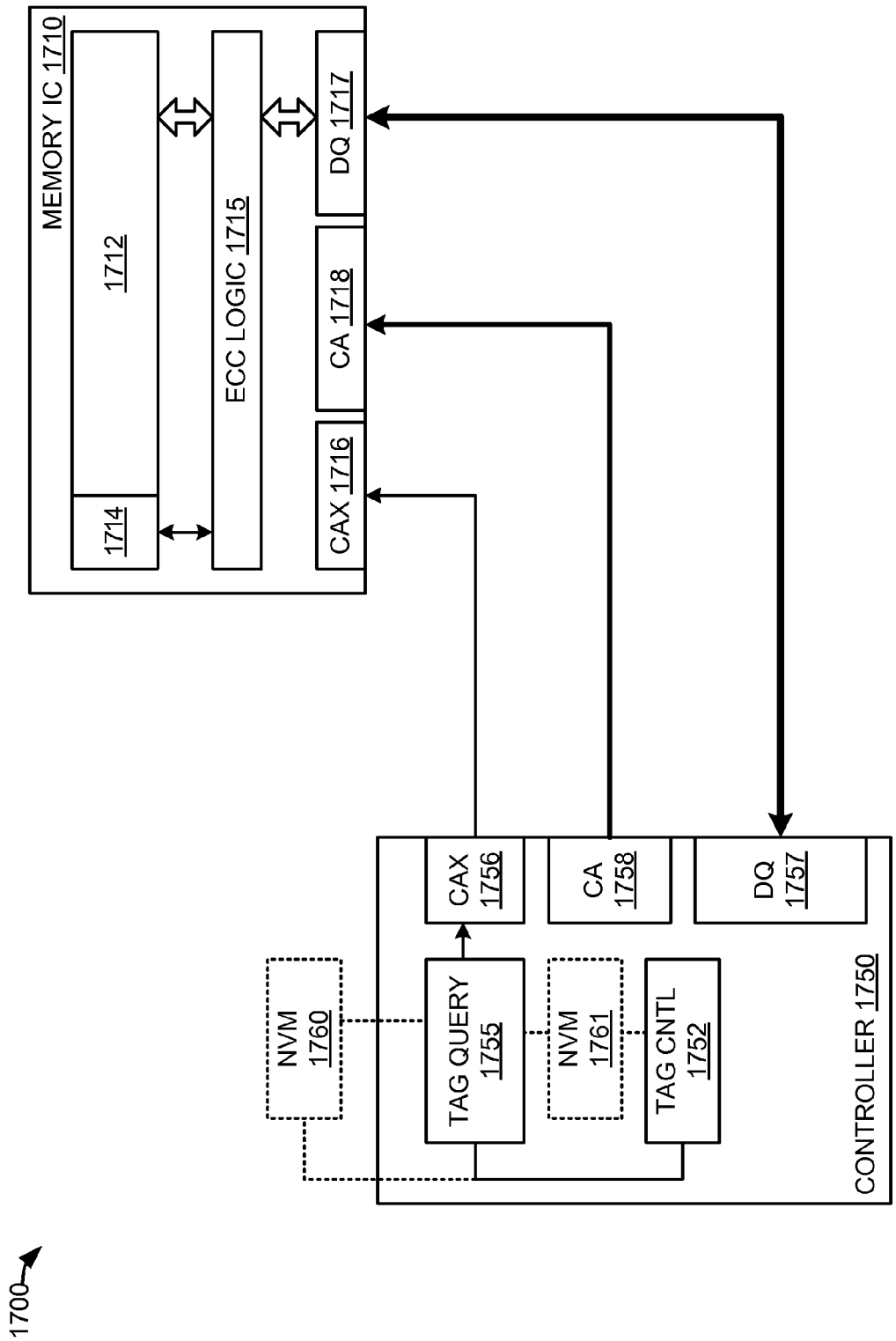
FIG. 17 is a block diagram illustrating a system which uses ECC repair internal to the memory device and tags external to the memory device.

FIG. 17 is a block diagram illustrating a system which uses ECC repair internal to the memory device and tags external to the memory device. System 1700 comprises memory IC 1710, controller 1750, and optionally external nonvolatile tag memory 1760. Controller 1750 includes tag query 1755, tag control 1752, secondary CA interface (CAX interface) 1756, CA interface 1758, DQ interface 1757, and optionally internal nonvolatile tag memory 1761. Memory IC 1710 includes main array 1712, repair array 1714, ECC logic 1715, secondary CA interface (CAX interface) 1716, CA interface 1718, and DQ interface 1717.

CAX interface 1756 of controller 1750 is operatively coupled to CAX interface 1716 of memory IC 1710. CA interface 1758 of controller 1750 is operatively coupled to CA interface 1718 of memory IC 1710. DQ interface 1757 of controller 1750 is operatively coupled to DQ interface 1717 of memory IC 1710. Tag control 1752 and tag query 1755 are operatively coupled to external nonvolatile memory 1760 and/or internal nonvolatile memory 1761, as appropriate for the presence of external nonvolatile memory 1760 and/or internal nonvolatile memory 1761.

Tag control 1752 load tags entries from external nonvolatile tag memory 1760 and/or internal nonvolatile memory 1761, as appropriate, into tag query 1755. During operation, tag query 1755 may provide memory IC 1710 with an address, and a hit indicator. In response to the address and the hit indicator memory IC 1710 (and ECC logic 1715, in particular) may correct data from a plurality of memory cells in main array 1712 using a plurality of bits from repair array 1712 as syndrome bits. This corrected data is coupled to DQ interface 1717 to be output by memory IC 1710.

Figure 18:
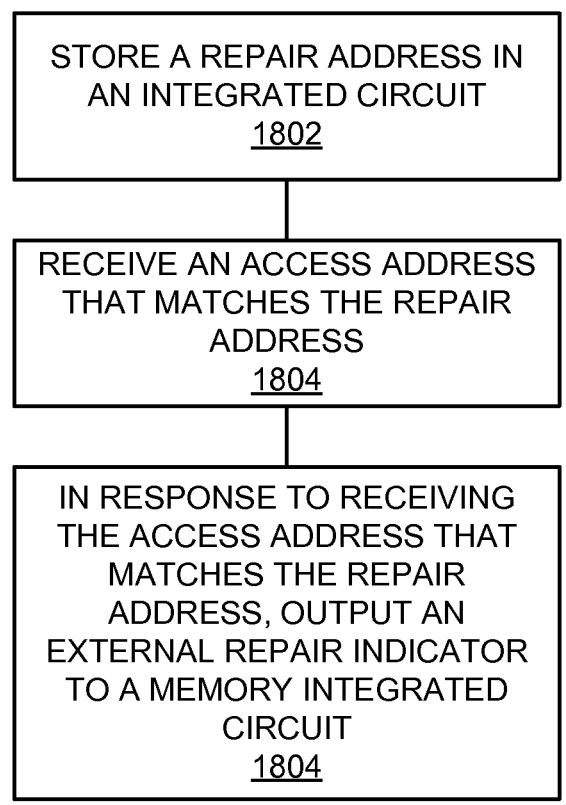
FIG. 18 is a flowchart illustrating a method of repairing a memory integrated circuit.

FIG. 18 is a flowchart illustrating a method of repairing a memory integrated circuit. One or more steps illustrated in FIG. 18 may be performed by, for example, one or more elements of system 100, system 200, system 700, system 1000, system 1100, system 1200, system 1300, system 1500, and system 1700.

A repair address is stored in an integrated circuit (1802). For example, controller 1180 (or buffer 1140) may store a repair address in internal nonvolatile tag memory 1141 or external nonvolatile tag memory 1142. An access address that matches the repair address is received (1804). For example, tag query 1145 may receive an access address from controller 1180 that matches a repair address stored in internal nonvolatile tag memory 1141 or external nonvolatile tag memory 1142. In response to receiving the access address that matches the repair address, an external repair indicator is output to a memory integrated circuit (1804). For example, buffer 1140 may, in response to receiving the access address from controller 1180 that matches the repair address stored in internal nonvolatile tag memory 1141 or external nonvolatile tag memory 1142, output an external repair indicator to memory devices 1150-1158 via secondary CA bus 1161.

Figure 19:
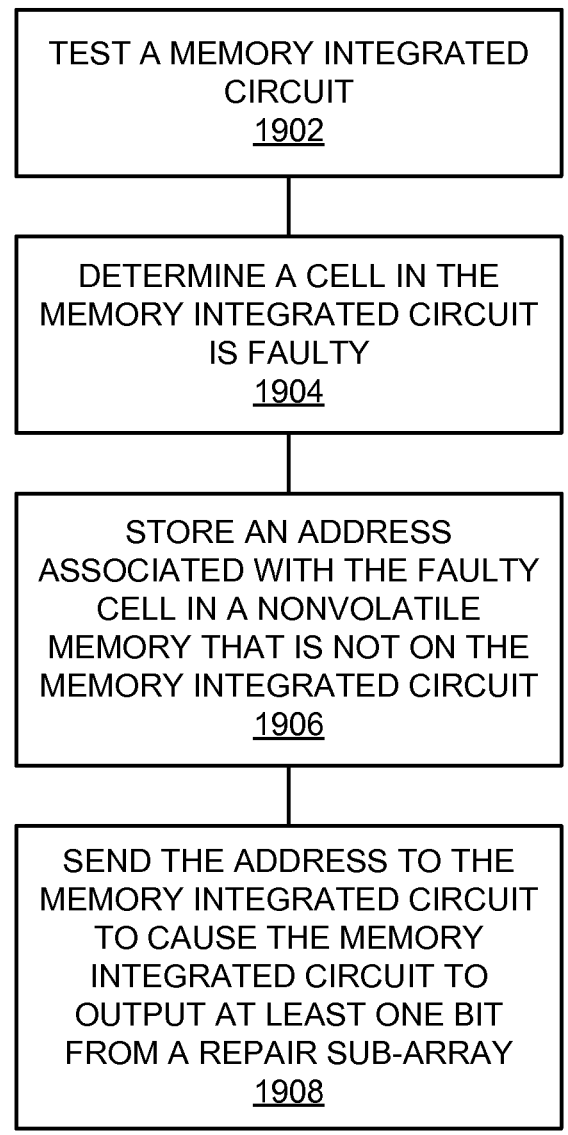
FIG. 19 is a flowchart illustrating a method of operating a memory controller.

FIG. 19 is a flowchart illustrating a method of operating a memory controller. One or more steps illustrated in FIG. 19 may be performed by, for example, one or more elements of system 100, system 200, system 700, system 1000, system 1100, system 1200, system 1300, system 1500, and system 1700.

A memory integrated circuit is tested (1902). For example, memory integrated circuit 1010 may be tested by controller 1050, or may be tested during manufacturing. A cell in the memory integrated circuit is determined to be faulty (1904). For example, during manufacturing, or during a test by controller 1050, a cell in main array 1012 of memory IC 1010 may be determined to be "weak" or non-functioning.

An address associated with the faulty cell is stored in a nonvolatile memory that is not on the memory integrated circuit (1906). For example, the address of the cell that was determined to be faulty by controller 1050 (or during manufacturing) is stored in external nonvolatile tag memory 1060. External nonvolatile tag memory 1060 is external to memory IC 1010. The address is sent to the memory integrated circuit to cause the memory integrated circuit to output at least one bit from a repair sub-array (1908). For example, tag query 1055 may send, via CAX interface 1056, the address of the cell that was determined to be faulty to memory IC 1010. In response, memory IC 1010 may substitute one or more data bits from repair sub-array 1014 for bits from main array 1012 before the other bits from main array 1012 are output by DQ interface 1017.

Figure 20:
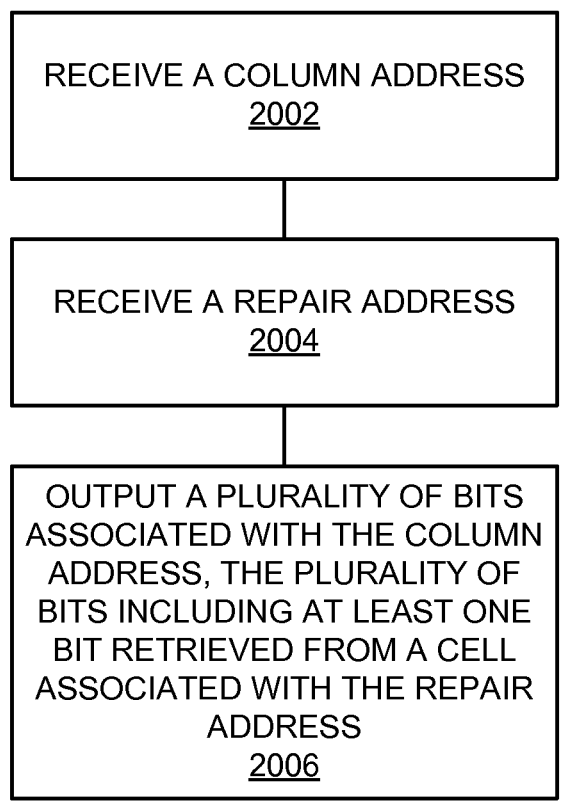
FIG. 20 is a flowchart illustrating a method of operating a memory integrated circuit.

FIG. 20 is a flowchart illustrating a method of operating a memory integrated circuit. One or more steps illustrated in FIG. 20 may be performed by, for example, one or more elements of system 100, system 200, system 300, system 400, system 700, system 1000, system 1100, system 1200, system 1300, system 1400, system 1500, and system 1700.

A column address is received (2002). For example, memory IC 110 may receive a column address from a memory controller. A repair address is received (2004). For example, memory IC 110 may receive a repair address from tag query 120. A plurality of bits associated with the column address and including at least one bit retrieved from a cell associated with the repair address are output (2006). For example, memory IC 110, via DQ interface 119, may output a plurality of bits composed of bits from main array 112 associated with the column address and at least one bit retrieved from repair array 114 that is substituted for a bit from main array 112 by column mux/demux 118.

Figure 21:
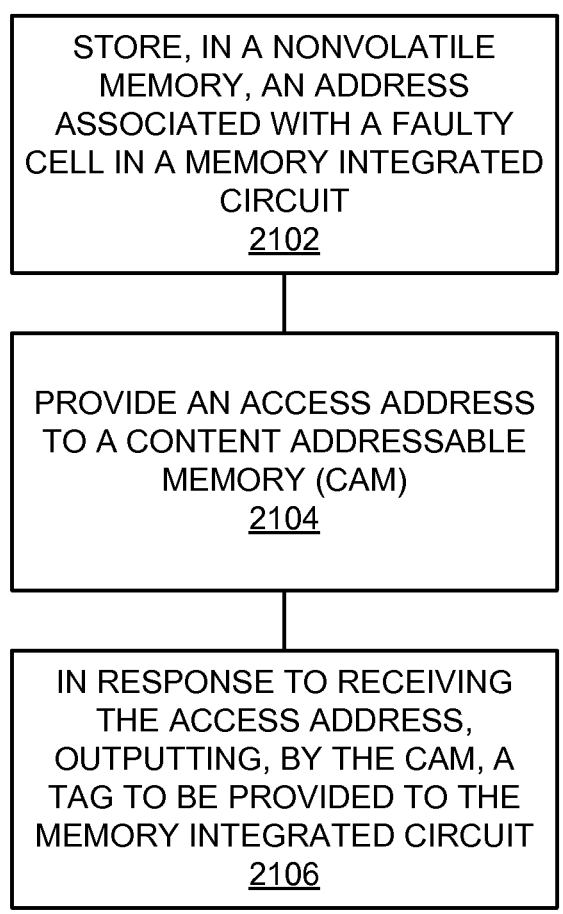
FIG. 21 is a flowchart illustrating a method of operating a memory controller.

FIG. 21 is a flowchart illustrating a method of operating a memory controller. One or more steps illustrated in FIG. 19 may be performed by, for example, one or more elements of system 100, system 200, system 700, system 1000, system 1100, system 1200, system 1300, system 1500, and system 1700.

In a nonvolatile memory, an address associated with a faulty cell in a memory integrated circuit is stored (2102). For example, an address associated with a faulty cell in memory IC may be stored in nonvolatile memory 122. An access address is provided to a content addressable memory—CAM (2104). For example, an access address may be provided to tag query 120. In response to receiving the access address, a tag to be provided to the memory integrated circuit is output by the CAM (2106). For example, in response to receiving the access address, tag query 120 may output a tag (e.g., TAG[1:P]) to be provided to memory IC 110.

The systems and devices described above may be implemented in computer systems, integrated circuits, or stored by computer systems. The systems described above may also be stored on a non-transitory computer readable medium. Devices, circuits, and systems described herein may be implemented using computer-aided design tools available in the art, and embodied by computer-readable files containing software descriptions of such circuits. This includes, but is not limited to, one or more elements of system 100, system 200, system 300, system 400, system 700, system 1000, system 1100, system 1200, system 1300, system 1400, system 1500, and system 1700, and their components. These software descriptions may be: behavioral, register transfer, logic component, transistor, and layout geometry-level descriptions. Moreover, the software descriptions may be stored on non-transitory storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, Blu-Ray, and so on.

Figure 22:
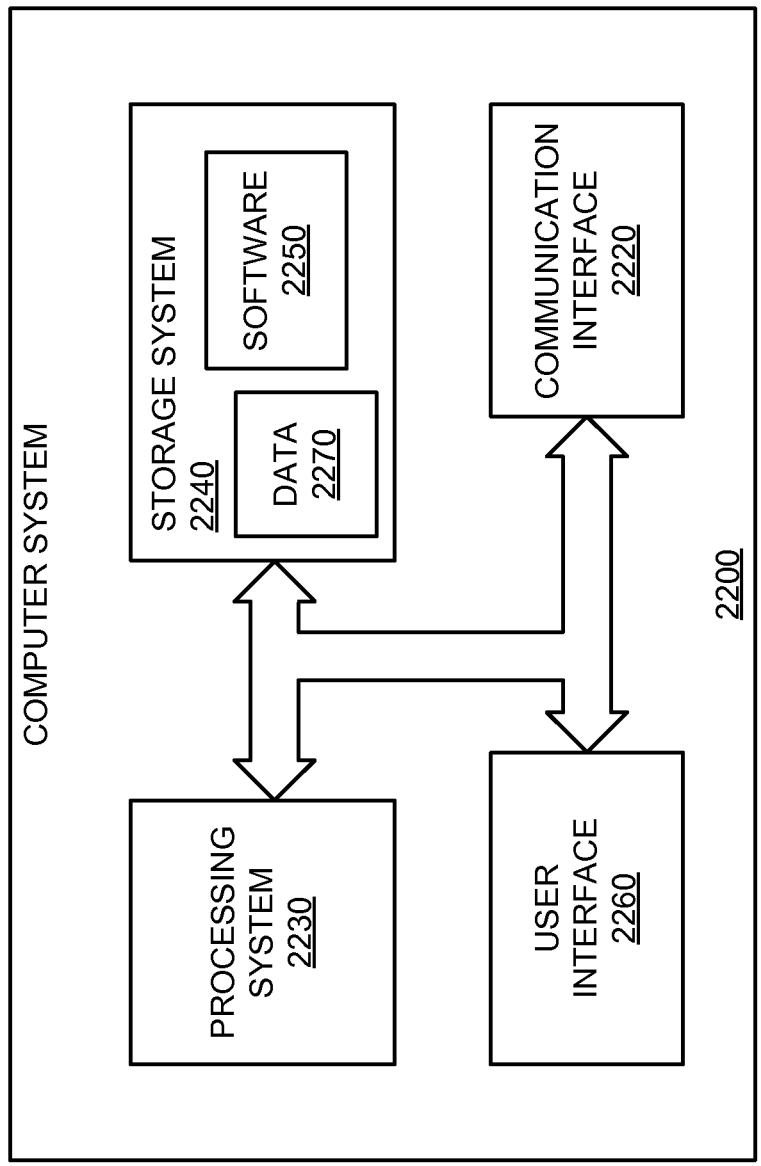
FIG. 22 is a block diagram of a computer system.

FIG. 22 illustrates a block diagram of a computer system. Computer system 2200 includes communication interface 2220, processing system 2230, storage system 2240, and user interface 2260. Processing system 2230 is operatively coupled to storage system 2240. Storage system 2240 stores software 2250 and data 2270. Computer system 2200 may include one or more of system 100, system 200, system 300, system 400, system 700, system 1000, system 1100, system 1200, system 1300, system 1400, system 1500, and system 1700, or components that implement the methods, circuits, and/or waveforms described herein. Processing system 2230 is operatively coupled to communication interface 2220 and user interface 2260. Computer system 2200 may comprise a programmed general-purpose computer. Computer system 2200 may include a microprocessor. Computer system 2200 may comprise programmable or special purpose circuitry. Computer system 2200 may be distributed among multiple devices, processors, storage, and/or interfaces that together comprise elements 2220-2270.

Communication interface 2220 may comprise a network interface, modem, port, bus, link, transceiver, or other communication device. Communication interface 2220 may be distributed among multiple communication devices. Processing system 2230 may comprise a microprocessor, microcontroller, logic circuit, or other processing device. Processing system 2230 may be distributed among multiple processing devices. User interface 2260 may comprise a keyboard, mouse, voice recognition interface, microphone and speakers, graphical display, touch screen, or other type of user interface device. User interface 2260 may be distributed among multiple interface devices. Storage system 2240 may comprise a disk, tape, integrated circuit, RAM, ROM, EEPROM, flash memory, network storage, server, or other memory function. Storage system 2240 may include computer readable medium. Storage system 2240 may be distributed among multiple memory devices.

Processing system 2230 retrieves and executes software 2250 from storage system 2240. Processing system 2230 may retrieve and store data 2270. Processing system 2230 may also retrieve and store data via communication interface 2220. Processing system 2230 may create or modify software 2250 or data 2270 to achieve a tangible result. Processing system 2230 may control communication interface 2220 or user interface 2260 to achieve a tangible result. Processing system 2230 may retrieve and execute remotely stored software via communication interface 2220.

Software 2250 and remotely stored software may comprise an operating system, utilities, drivers, networking software, and other software typically executed by a computer system. Software 2250 may comprise an application program, applet, firmware, or other form of machine-readable processing instructions typically executed by a computer system. When executed by processing system 2230, software 2250 or remotely stored software may direct computer system 2200 to operate.

The above description and associated figures teach the best mode of the invention. The following claims specify the scope of the invention. Note that some aspects of the best mode may not fall within the scope of the invention as specified by the claims. Those skilled in the art will appreciate that the features described above can be combined in various ways to form multiple variations of the invention. As a result, the invention is not limited to the specific embodiments described above, but only by the following claims and their equivalents.

What is claimed is:

1. A memory integrated circuit, comprising:
    a memory array having a plurality of columns and a plurality of rows, the memory array comprising at least one repair column comprising at least one repair element, each of the at least one repair elements comprising at least one repair cell;
    an external command/address interface to receive a command, a row address, and a column address from a source external to the memory integrated circuit, the row address to select a row of the plurality of rows to output a row of data, the column address to select a subset of the row of data; and,
    an external repair address interface to receive a repair enable indicator and a repair address from the source external to the memory integrated circuit, the repair address corresponding to a column of a subset of the plurality of rows, the memory integrated circuit to determine, based on the command and the repair enable indicator, whether data from the repair column is to be output by the memory.

2. The memory of claim 1, wherein the data from the at least one repair column replaces data from one of the plurality of columns.

3. The memory of claim 1, wherein the data from the at least one repair column is to be used as syndrome bits for an error detect and correct code used to correct data from one of the plurality of columns.

4. The memory of claim 1 wherein the command, row address, and column address are to be received synchronously with respect to an external timing reference signal, and the repair address is to be received synchronously with respect to the external timing reference signal.

5. The memory of claim 1, wherein a second repair address can be received before the data from the repair column is to be output by the memory.

6. The memory of claim 1, further comprising:
    self-test circuitry to detect a cell that meets a criteria for designation as a failing cell.

7. The memory of claim 6, wherein the failing cell address is to be coupled to a nonvolatile memory.

8. A memory module, comprising:
    a plurality of memory integrated circuits comprising at least a first memory integrated circuit and a second memory integrated circuit, the first memory integrated circuit having a first repair memory subarray, the second memory integrated circuit having a second repair memory subarray;
    a first address bus, external to the plurality of memory integrated circuits, to distribute row and column access addresses to the plurality of memory integrated circuits; and,
    a second address bus, external to the plurality of memory integrated circuits, to distribute repair addresses to the plurality of memory integrated circuits, the second address bus to also cause the first memory integrated circuit to output data stored in the first repair memory subarray and to cause the second memory integrated circuit not to output data stored in the second memory subarray.

9. The memory module of claim 8, further comprising:
    a buffer integrated circuit, the buffer integrated circuit to drive the first address bus and the second address bus.

10. The memory module of claim 9, further comprising:
    a nonvolatile memory device, the nonvolatile memory device coupled to the buffer integrated circuit to provide the buffer integrated circuit with a repair address, the buffer integrated circuit to drive the second address bus with a first part of the repair address.

11. The memory module of claim 9, wherein the buffer integrated circuit further comprises a nonvolatile memory to store a repair address, the buffer integrated circuit to drive the second address bus with a first part of the repair address.

12. The memory module of claim 10, wherein the buffer integrated circuit is to drive a control indicator, the control indicator to cause the first memory integrated circuit to output data stored in the first repair memory subarray.

13. The memory module of claim 10, wherein an access address is to be received, by the plurality of memory integrated circuits and on the first address bus, synchronously with respect to a timing reference signal, and a repair address is to be received, by the plurality of memory integrated circuits and on the second address bus, synchronously with respect to the timing reference signal.

14. The memory module of claim 10, further comprising:
a buffer integrated circuit, the buffer integrated circuit to drive the first address bus and the second address bus, the buffer integrated circuit to receive from the first memory integrated circuit a failing cell address that is associated with a cell that meets a criteria for designation as a failing cell.

15. A method of repairing a first memory integrated circuit of a plurality of memory integrated circuits that reside on a common substrate, comprising:
storing a repair address in an integrated circuit, the repair address corresponding to a column of a subset of rows of the first memory integrated circuit;
receiving, by the integrated circuit, an access address that matches the repair address; and,
in response to receiving the access address that matches the repair address, outputting, by the integrated circuit, an external repair indicator to the plurality of memory integrated circuits, the external repair indicator to indicate the first memory integrated circuit is to output data stored in a respective internal repair sub-array, the external repair indicator to also indicate that at least one of the plurality of memory integrated circuits are not to output data stored in a corresponding respective internal repair sub-array.

16. The method of claim 15, wherein the data from the respective internal repair sub-array replaces data from a sub-array of a plurality of sub-arrays storing data in the first memory integrated circuit.

17. The method of claim 15, further comprising:
receiving a failing cell address associated with a failing cell from the first memory integrated circuit.

18. The method of claim 17, wherein the failing cell address is received on an interface that outputs the external repair indicator to the plurality of memory integrated circuits.

19. The method of claim 18, further comprising:
storing the failing cell address in a nonvolatile memory.

20. The method of claim 19, wherein the nonvolatile memory is disposed on the integrated circuit.

* * * * *